(12) United States Patent
Jacobsson et al.

(10) Patent No.: US 10,039,220 B2
(45) Date of Patent: Jul. 31, 2018

(54) METHOD, SYSTEM AND DEVICE FOR IMPROVED STORAGE AND HANDLING OF COMPONENTS

(71) Applicant: Mycronic AB, Taby (SE)

(72) Inventors: Nils Jacobsson, Taby (SE); Roger Jonasson, Taby (SE)

(73) Assignee: Mycronic AB, Taeby (SE)

( * ) Notice: Subject to any disclaimer, the term of this patent is extended or adjusted under 35 U.S.C. 154(b) by 0 days.

(21) Appl. No.: 15/022,799

(22) PCT Filed: Sep. 17, 2014

(86) PCT No.: PCT/EP2014/069831
§ 371 (c)(1),
(2) Date: Mar. 17, 2016

(87) PCT Pub. No.: WO2015/040079
PCT Pub. Date: Mar. 26, 2015

(65) Prior Publication Data
US 2016/0212899 A1    Jul. 21, 2016

Related U.S. Application Data

(60) Provisional application No. 61/879,172, filed on Sep. 18, 2013.

(51) Int. Cl.
*H05K 13/04* (2006.01)
*B65G 1/137* (2006.01)
(Continued)

(52) U.S. Cl.
CPC ......... *H05K 13/0417* (2013.01); *B65G 1/137* (2013.01); *B65G 1/1371* (2013.01);
(Continued)

(58) Field of Classification Search
CPC .. H05K 13/08; H05K 13/021; H05K 13/0061; H05K 13/0417; H05K 13/0434; B65G 1/1371; B65G 1/137
See application file for complete search history.

(56) References Cited

U.S. PATENT DOCUMENTS

| 4,651,363 A | 3/1987 | Reuter et al. |
| 4,651,863 A * | 3/1987 | Reuter ................... B65G 1/133 198/339.1 |

(Continued)

FOREIGN PATENT DOCUMENTS

| DE | 102006022371 A1 | 11/2007 |
| EP | 1147697 A1 | 10/2001 |

(Continued)

OTHER PUBLICATIONS

International Search Report PCT/ISA/210 for International Application No. PCT/EP2014/069831 dated Feb. 20, 2015.
(Continued)

*Primary Examiner* — Thomas Randazzo
(74) *Attorney, Agent, or Firm* — Harness, Dickey & Pierce, P.L.C.

(57) ABSTRACT

A method for retrieving and presenting objects in an automated Surface Mount Device (SMD) warehouse adapted to obtain information related to upcoming SMT jobs, the method comprising receiving at least one of input data and a parameter representing a position within said automated Surface Mount Device (SMD) warehouse; retrieving a bin from said position within said automated SMD warehouse at least partly based on said at least one of input data and/or a parameter representing said position within said automated Surface Mount Device (SMD) warehouse; and -presenting
(Continued)

said retrieved bin at, or close to, an output port, such as an opening, of said automated Surface Mount Device (SMD) warehouse.

23 Claims, 21 Drawing Sheets

(51) Int. Cl.
*G05B 19/418* (2006.01)
*H05K 13/02* (2006.01)
*H05K 13/08* (2006.01)

(52) U.S. Cl.
CPC ..... *G05B 19/41865* (2013.01); *H05K 13/021* (2013.01); *H05K 13/0404* (2013.01); *H05K 13/0434* (2013.01); *H05K 13/08* (2013.01); *G05B 2219/34349* (2013.01); *G05B 2219/45026* (2013.01)

(56) References Cited

U.S. PATENT DOCUMENTS

| | | | | |
|---|---|---|---|---|
| 5,321,885 A * | 6/1994 | Hino | ............... | B23P 21/004 209/573 |
| 5,429,470 A * | 7/1995 | Nicol | ............... | G11B 15/6835 360/92.1 |
| 5,456,001 A | 10/1995 | Mori et al. | | |
| 6,272,743 B1 * | 8/2001 | Nishimori | ............... | H05K 13/0061 29/740 |
| 6,572,702 B1 * | 6/2003 | Freeman | ............... | B23P 21/004 118/313 |
| 6,631,870 B2 * | 10/2003 | Bergstrom | ............... | H05K 13/0417 242/615 |
| 6,817,527 B2 * | 11/2004 | Hellberg | ............... | H05K 1/0266 235/375 |
| 6,869,040 B2 * | 3/2005 | Eskang | ............... | H05K 13/0417 156/767 |
| 7,651,310 B2 * | 1/2010 | Gambarelli | ............... | B65G 1/133 414/280 |
| 9,095,086 B2 * | 7/2015 | Peng | ............... | H05K 13/0061 |
| 2014/0222191 A1 * | 8/2014 | Blumenau | ............... | B22D 33/00 700/218 |

FOREIGN PATENT DOCUMENTS

| | | |
|---|---|---|
| EP | 1381265 A1 | 1/2004 |
| KR | 20120139263 A | 12/2012 |
| WO | WO-03024181 A1 | 3/2003 |

OTHER PUBLICATIONS

International Search Report PCT/ISA/210 for International Application No. PCT/EP2014/069837 dated Feb. 20, 2015.

* cited by examiner

METHOD, SYSTEM AND DEVICE FOR IMPROVED STORAGE AND HANDLING OF COMPONENTS

CROSS-REFERENCE TO RELATED APPLICATIONS

This application is a National Stage Application of PCT/EP2014/069831 filed on Sep. 17, 2014, which claims benefit of U.S. Provisional Application No. 61/879,172 filed on Sep. 18, 2013 the entire contents of each of which are hereby incorporated by reference.

TECHNICAL FIELD

The present invention relates to handling of components in an SMT system, in particular storage and retrieval of components in an automated Surface Mount Device (SMD) warehouse

BACKGROUND

Surface Mount Technology is the preferred method of automated production of electronic printed circuit boards. Machines for pick-and-place mounting of electronic components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head is moved to a component feeder area, where the mounting head picks one or more electronic components from one or more pick-up positions of component feeders or tape guides, and then is moved to a mounting area where the mounting head places the component or components on the substrate.

Supplies of a certain type of component, e.g. a certain specified type of capacitor, resistor, diode or IC are supplied on trays carrying one type of component or on sticks or, as has become most common today, on tapes in reels with a series of pockets of appropriate depth in the tape, holding one component in each pocket. The reels have varying widths between 8 mm and 44 mm. A row of component tape reels, each reel representing a certain type of component, are typically placed in a certain slot/position (among a pre-defined number of compartments or slots adapted to receive one reel each) in a trolley having a driving/feeding mechanism, or a certain compartment/slot/position in a non-motorized bin which in turn is placed in a magazine, or pick-and-place machine, having a driving/feeding mechanism such as a motor.

When preparing an upcoming SMT job, the component tape reels are typically pre-loaded into their respective component feeders, or tape guides, before they are placed in a motorized trolley, or non-motorized bin. The component feeders, or tape guides, may or may not therefore have their own built-in tape advancing/driving mechanism, e.g. a motor, and are adapted to guide and/or feed components of the component tape reels to their respective feeder positions, or pick-ip positions of the pick-and-place machine, as the mounting head of the pick-and-place machine rapidly picks components out of their pockets and place them on the board. Component manufacturers deliver the components in standard reels of pocket-tape with a thin cover tape closing the pockets. This pocket cover tape must be removed by some method before the component can be picked out of its pocket.

As mentioned above, the tape guides or feeders are used to feed and/or guide the component tape to the pick-and-place machine as the components are picked out of the pockets. One such tape guide or feeder is described in various patents by the applicant, e.g. EP 1 381 265 B1, incorporated herein by reference. This type of component tape guide or feeder has no built-in tape advancing mechanism. Rather, the tape guide or feeder is mounted for use in the pick-and-place machine so that a feeding mechanism, e.g. a feeding wheel in the tape magazine or pick-and-place machine protrudes through the tape guide or feeder into contact with the pre-threaded tape. Another type of component tape guide has a built-in tape advancing mechanism. The tape guide or feeder is mounted for use in the pick-and-place machine so that an in-feeder built-in feeding mechanism or tape advancing mechanism advances the tape, e.g. a feeding wheel in the feeder into contact with the pre-threaded tape.

In state of the art solutions provided by the applicant, each tape guide or feeder has a specific identity in relation to the pick-and-place machine and in whatever sequential position the reel with its pre-threaded tape guide or feeder is placed in the machine, and the mounting head of the pick-and-place machine will, based on the identity of the tape guide and the feeder position it is feeding components to the pick-and-place machine from, properly find and pick-up the proper components from the tape pockets. A method of associating the identity of the tape guide or feeder used to the specifics of the components in the tape threaded into the guide or feeder is described in various patents by the applicant, e.g. EP 1 147 697 B1, which is incorporated herein by reference.

Bins are in state of the art systems provided by the applicant used to house a row of reels in a magazine as the pick-and-place machine picks components out of the pockets of the pocket-tape. A bin has a predefined number of slots adapted to receive reels. One such bin is shown in WO03024181 A1, incorporated herein by reference.

Therefore, there is a need to improve handling of components in an SMT system, in particular storage and retrieval of components in an automated Surface Mount Device (SMD) warehouse.

SUMMARY

The invention relates to improved handling of components in an SMT system.

The invention relates to a method, system and device for automated storage and retrieval of a bin, such as a basket without own driving means or a trolley with wheels and with or without driving means, having a pre-defined number of compartments or slots where each compartment/slot of the bin is adapted to receive and carry/hold one component tape reel and/or packet of component tape reel and component feeder/tape guide, in an automated storage unit configured with an actuator such as a robot for storing electronic components, e.g. a SMD warehouse.

The common features of a bin, or trolley/magazine, according to the technology disclosed is that it is a device/unit configured with a pre-defined number of compartments/slots/positions where each compartment/slot/position of the plurality of compartments/slots/positions is adapted to receive and carry/hold one bin load unit each, and where a bin load unit according to the technology disclosed may be a component tape reel and/or may be a unit/packet comprising a component tape reel, e.g. a bin load unit may be a tape guide/component feeder with or without own driving/feeding mechanism (e.g. motor) which is loaded with a component tape reel. In certain aspects of the technology disclosed, the bin load unit may be a pallet configured for and carrying/holding a component tape reel or it may even be a pallet configured for and carrying/holding a component tape reel pre-threaded into a tape guide/component feeder.

Essential aspects of the technology disclosed is that the tapes are pre-threaded into the proper tape guides or feeder and that each component tape reel is associated, by coding, suitably bar coding, with its tape guide or feeder, which in the continued processing will be the for the pick and place machine the reel with the proper components. According to certain aspects of the technology disclosed, association may be performed between any of a Bin ID (e.g. a Trolley ID or even a Magazine ID), Pallet ID, component tape reel ID and SMT tape guide/feeder ID by storing the IDs in a data structure in an SMT information database.

One of the purposes of the present invention is to achieve a system and a method that simplifies and speeds up the process of surface mounting SMD components on circuit boards, by eliminating process-halting manual tape reel loading steps involved in the previously known systems and methods.

The technology disclosed offers a solution where input data is received, either from an operator or from an SMT information database relating to an upcoming SMT job; where a bin is retrieved based on said input data and a parameter representing a position within an automated Surface Mount Device (SMD) warehouse, said bin is comprised of a plurality of compartments/slots/positions each adapted to comprise one bin load unit each, wherein said bin is carrying/holding at least one bin load unit constituting or comprised of a component tape reel, and wherein said SMD warehouse is configured to present said retrieved bin at a port of said automated SMD warehouse.

In one or more aspects of the technology disclosed, a method is proposed for retrieving and presenting objects in an automated Surface Mount Device (SMD) warehouse adapted to obtain information related to upcoming SMT jobs, said automated SMD warehouse comprising an actuator such as a mechanical actuator or robot, the method comprising the actions of:

receiving at least one of input data and a parameter representing a position within said automated Surface Mount Device (SMD) warehouse;

retrieving, by the use of said actuator, e.g. a mechanical actuator or robot of the SMD warehouse, a bin, such as a basket/trolley with or without wheels and with or without a driving/feeding mechanism, from said position within said automated SMD warehouse at least partly based on said at least one of input data and/or a parameter representing said position within said automated Surface Mount Device (SMD) warehouse; and presenting, by the use of said actuator, e.g. a mechanical actuator or robot of the SMD warehouse, said retrieved bin at, or close to, an output port, such as an opening, of said automated Surface Mount Device (SMD) warehouse, where said retrieved bin (basket or trolley) is carrying/holding at least one bin load unit constituting or comprising a component tape reel.

In one or more aspects of the technology disclosed, a method is proposed for retrieving and presenting objects in an automated Surface Mount Device (SMD) warehouse adapted to obtain information related to upcoming SMT jobs, said automated SMD warehouse comprising at least one actuator such as a mechanical actuator or robot adapted for handling said objects, the method comprising:

receiving at least one of input data and a parameter representing a position within said automated Surface Mount Device (SMD) warehouse;

retrieving a bin, by the use of said at least one actuator, loaded with a plurality of bin load units, from said position within said automated SMD warehouse at least partly based on said at least one of input data and/or a parameter representing said position within said automated Surface Mount Device (SMD) warehouse, wherein each of said plurality of bin load units is comprising or constituting a component tape reel; and presenting, by the use of said at least one actuator, said retrieved bin at, or close to, an output port, such as an opening, of said automated Surface Mount Device (SMD) warehouse.

In the receiving step of the above-mentioned methods and according to certain aspects of the technology disclosed, said automated Surface Mount Device (SMD) warehouse is providing an input/output interface and said input data is received from said input/output interface based on an operator indication of an upcoming SMT job.

In the receiving step of the above-mentioned methods and according to certain aspects of the technology disclosed, said input data is received, or retrieved, from an SMT information database and said input data is associated with, or is indicating, an upcoming SMT job.

In one or more aspects of the technology disclosed, said automated Surface Mount Device (SMD) warehouse is part of an integrated automated Surface Mount Device (SMD) warehouse cluster, wherein the retrieving step in the above-mentioned methods comprise redistributing said bin from a second automated Surface Mount Device (SMD) warehouse comprised in said integrated automated Surface Mount Device (SMD) warehouse cluster to said automated Surface Mount Device (SMD) warehouse prior to presenting said bin at, or close to, said output port of said automated Surface Mount Device (SMD) warehouse.

In the receiving step of the above-mentioned methods and according to certain aspects of the technology disclosed, said parameter representing said position within said automated Surface Mount Device (SMD) warehouse is retrieved from a memory in said automated Surface Mount Device (SMD) warehouse.

In the receiving step of the above-mentioned methods and according to certain aspects of the technology disclosed, said retrieving of a bin is performed based on an upcoming SMT job, wherein the SMT job comprises data indicative of required components in said upcoming SMT job, and wherein said bin has been pre-loaded with bin load units based on said SMT job.

A method in an automated Surface Mount Device (SMD) warehouse adapted to obtain information related to upcoming SMT jobs and to store SMT job related objects at a plurality of positions within said automated Surface Mount Device (SMD) warehouse and where said automated SMD warehouse comprising at least one actuator such as a mechanical actuator or robot adapted for handling said objects, the method comprises:

receiving, by using said at least one actuator of said automated SMD warehouse, a bin (e.g. a basket or trolley) at an input port such as an opening of said automated Surface Mount Device (SMD) warehouse;

storing, by using said at least one actuator of said automated SMD Warehouse, said bin at one of said plurality of positions within said automated Surface Mount Device (SMD) warehouse, wherein said bin is comprising a plurality of bin load units, and wherein each of said plurality of bin load units is comprising or constituting a component tape reel.

In one or more aspects of the technology disclosed, the above-mentioned methods may further comprise the step of:

determining the identity of said bin prior to presenting said bin at, or close to, said output port of said automated Surface Mount Device (SMD) warehouse;

In further aspects of the technology disclosed, said determining of the bin identity prior to presenting said bin may further comprise the steps of:

obtaining the identity (ID) of the bin, e.g. through RFID and/or WiFi communication involving a RFID tag and/or WiFi tag attached to the bin or by the scanning of a barcode attached to the bin; and storing the obtained identity (ID) of said bin presented at said port to at least one of a memory in said automated Surface Mount Device (SMD) warehouse and an SMT information database.

In one or more aspects of the technology disclosed, the above-mentioned methods may further comprise the step of:

determining tape reel identities of component tape reels comprised in said bin;

In further aspects of the technology disclosed, said determining of tape reel identities of component tape reels comprised in said bin may further comprise:

scanning individual identity tags attached to component tape reels; and storing the identity (ID) of each component tape reel scanned to at least one of a memory in said automated Surface Mount Device (SMD) warehouse and an SMT information database.

In further aspects of the technology disclosed, said storing of the identity further comprises storing the position of the stored bin to at least one of a memory in said automated Surface Mount Device (SMD) warehouse and/or in an SMT information database.

In further aspects of the technology disclosed, said determining of tape reel identities of component tape reels comprised in said bin may further comprise:

gripping a bin load unit comprised in one of a plurality of discrete bin load unit positions in said bin by an actuator comprised in said automated Surface Mount Device (SMD) warehouse; and lifting said bin load unit at least partly out of said bin to thereby enable the scanning of individual identity tags attached to a component tape reel by a scanner comprised in said automated Surface Mount Device (SMD) warehouse.

In further aspects of the technology disclosed, the above-mentioned methods may further comprise the step of:

replacing said bin load unit in said bin with another bin load unit stored in said automated Surface Mount Device (SMD) warehouse.

In further aspects of the technology disclosed, the above-mentioned methods may further comprise the step of:

removing said bin load unit from said bin.

In further aspects of the technology disclosed, the above-mentioned methods may further comprise the step of:

moving said bin load unit to an intermediate position within said automated Surface Mount Device (SMD) warehouse;

In further aspects of the technology disclosed, said individual identity tags are barcodes adapted to be scanned by a barcode scanner unit and through said scanning provide information to the barcode scanner unit.

In further aspects of the technology disclosed, said determining of tape reel identities of the component tape reels comprised in said bin comprises:

scanning, or reading, individual identity tags attached to pallets comprising component tape reels, whereby individual pallet IDs are obtained from said scanning or reading of individual identity tags attached to pallets; and retrieving the ID of component tape reels associated with said obtained pallet IDs from said SMT information database.

In one or more embodiments, wherein said determining of tape reel identities of component tape reels comprised in said bin comprises:

scanning or reading an identity tag attached to said bin to obtain bin IDs;

retrieving the IDs of component tape reel IDs associated to said bin IDs from said SMT information database.

In any of the above-mentioned methods, said identity tag may be a Radio Frequency Identification (RFID) tag, a WiFi tag, a barcode, or any one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader#Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode and WaterCode or any other type of active communication tag known to a person skilled in the art.

In further aspects of the technology disclosed when receiving at least one of input data and a parameter representing a position, said position is stored as a parameter representing a position within said automated Surface Mount Device (SMD) warehouse, and the above-mentioned methods comprising the further actions of:

storing bins at predetermined positions within said automated Surface Mount Device (SMD) warehouse by sending control data from a processor to said actuator, wherein said bins are adapted to comprise bin load units, and wherein said bin load unit comprises or constitutes a component tape reel.

receiving input data; and retrieving a bin based on said input data and a parameter representing a position within said automated Surface Mount Device (SMD) warehouse by sending control data to said actuator, wherein said bin is adapted to comprise bin load units, and wherein each of said bin load unit comprises or constitutes a component tape reel.

The technology disclosed proposes an automated SMD warehouse comprising:

a processor; and an actuator, such as a mechanical actuator, robot or robotic arm, communicatively coupled to said processor;

wherein said processor is configured to receiving, e.g. from an operator (e.g. pushing a button) or from a memory or processor in an external communications network to which said automated SMD warehouse/processor is connected, at least one of input data, a parameter or SMT job related information representing a position (or where said position is calculated/determined, by said automated SMD warehouse/processor, based on said input data/parameter or SMT job related information) within said automated SMD warehouse, or a position within a cluster of plurality of automated SMD warehouses which said automated SMD warehouse is part of, and to send control data to the actuator at least partly based on the obtained information and/or instructions; and wherein the actuator of said automated SMD warehouse is configured to retrieve a bin, such as a basket or trolley, carrying/holding a plurality of bin load units, from a position within said automated SMD warehouse, or a position within a cluster of automated SMD warehouses, and where said automated SMD warehouse is further configured to present said bin at, or close to, an output port, such as an opening, of said automated SMD warehouse based on control data from said processor.

In further aspects of the technology disclosed, and as mentioned above, said automated SMD warehouse may be part of an integrated automated Surface Mount Device (SMD) warehouse cluster comprising a plurality of automated SMD warehouses, where at least a plurality of said automated SMD warehouses comprising at least one actuator such as a robot arm, and wherein retrieving said bin further comprise redistributing said bin (trolley) from a second automated Surface Mount Device (SMD) warehouse also part of said integrated automated Surface Mount Device (SMD) warehouse cluster to said automated Surface Mount Device (SMD) warehouse through a port or opening shared between said first and said second automated Surface Mount Device (SMD) warehouses.

In further aspects of the technology disclosed, said automated Surface Mount Device (SMD) warehouse comprising:
a processor; and
an actuator, such as a robot or robotic arm, communicatively coupled to said processor.

In further aspects of the technology disclosed, said processor is configured to receiving at least one of input data and a parameter representing a position within said automated Surface Mount Device (SMD) warehouse and to send control data to the actuator at least partly based on the obtained information and/or instructions.

In further aspects of the technology disclosed, the actuator is configured to retrieve a bin from said position within the automated Surface Mount Device (SMD) warehouse and presenting said retrieved bin at, or close to, an output port, such as an opening, of said automated Surface Mount Device (SMD) warehouse based on control data received from said processor.

In further aspects of the technology disclosed, said processor in said automated Surface Mount Device (SMD) warehouse and is adapted to perform the steps of:
receiving input data;
retrieving a bin based on said input data and a parameter representing a position within said automated Surface Mount Device (SMD) warehouse by sending control data to said actuator, wherein said bin is adapted to comprise bin load units, and wherein each of said bin load unit comprises or constitutes a component tape reel;
presenting said retrieved bin by said actuator at a port of said automated Surface Mount Device (SMD) warehouse by sending control data to said actuator.

In further aspects of the technology disclosed an automated Surface Mount Device (SMD) warehouse comprising:
a processor, and
an actuator, such as a robot or robotic arm, wherein the actuator is configured to retrieve at least one bin loaded with, or carrying/holding, a plurality of bin load units, said bin load units each comprising or constituting a component tape reel, wherein the actuator is configured to retrieve said at least one bin from predetermined positions within the automated Surface Mount Device (SMD) warehouse, and wherein the actuator is configured to receive control data from said processor and retrieve the at least one bin based on the control data.

In further aspects of the technology disclosed, said actuator may be further communicatively coupled to said processor, wherein said processor may be configured to receiving at least one of input data and a parameter representing a position within said automated Surface Mount Device (SMD) warehouse and may be configured to send control data to the actuator at least partly based on the obtained information and/or instructions In further aspects of the technology disclosed, said automated Surface Mount Device (SMD) warehouse may further comprise a communications interface configured to receive and/or retrieve input data from a SMT information database via a communications network, wherein said processor is further configured to receive input data from said communications network, and wherein said input data is associated with, or is indicating, an upcoming SMT job.

In further aspects of the technology disclosed, said processor may be configured to obtain information and/or instructions related to upcoming SMT jobs and to send control data to the actuator at least partly based on the obtained information and/or instructions.

In further aspects of the technology disclosed, said SMD Warehouse may further comprise an input/output interface and wherein said actuator is configured to receive input data from said input/output interface based on an operator indication of an upcoming SMT job.

In further aspects of the technology disclosed, said SMD Warehouse may further comprise a communications interface configured to receive and/or retrieve input data from a SMT information database via a communications network and wherein said input data is associated with, or is indicating, an upcoming SMT job.

In further aspects of the technology disclosed, said automated Surface Mount Device (SMD) warehouse system may comprise:
an actuator, such as a robot or robotic arm, adapted to retrieve and/or store bins, pallets and/or component tape reels at predetermined positions within the automated Surface Mount Device (SMD) warehouse based on control data received from a processor,
a memory
a processor configured to obtain information related to upcoming SMT jobs;
wherein said actuator is configured to store bins at predetermined positions within said automated Surface Mount Device (SMD) warehouse by receiving control data from said processor, and wherein said bins are adapted to comprise bin load units, wherein said bin load unit comprises at least a component tape reel,
and wherein said processor of said automated Surface Mount Device (SMD) warehouse system is further configured to control the steps of:
receiving a bin at a port of said automated Surface Mount Device (SMD) warehouse by providing said actuator with control data; and
storing said bin at a position within said automated Surface Mount Device (SMD) warehouse by providing said actuator with said control data.

In further aspects of the technology disclosed, a computer program product comprising computer readable code configured to, when executed in a processor, perform any or all of the methods described herein.

In further aspects of the technology disclosed, a non-transitory computer readable memory on which is stored computer readable code configured to, when executed in a processor, perform any or all of the methods described herein.

In further aspects of the technology disclosed, computer program product comprising computer readable code configured to, when executed in a processor, perform any or all of the methods described herein.

In further aspects of the technology disclosed, a non-transitory computer readable memory on which is stored computer readable code configured to, when executed in a processor, perform any or all of the methods described herein.

BRIEF DESCRIPTION OF DRAWINGS

These and other aspects of the invention will be described in the following description of the invention, given merely as one non-restricting example, with reference to the attached drawings, of which.

DETAILED DESCRIPTION

Figure 1:
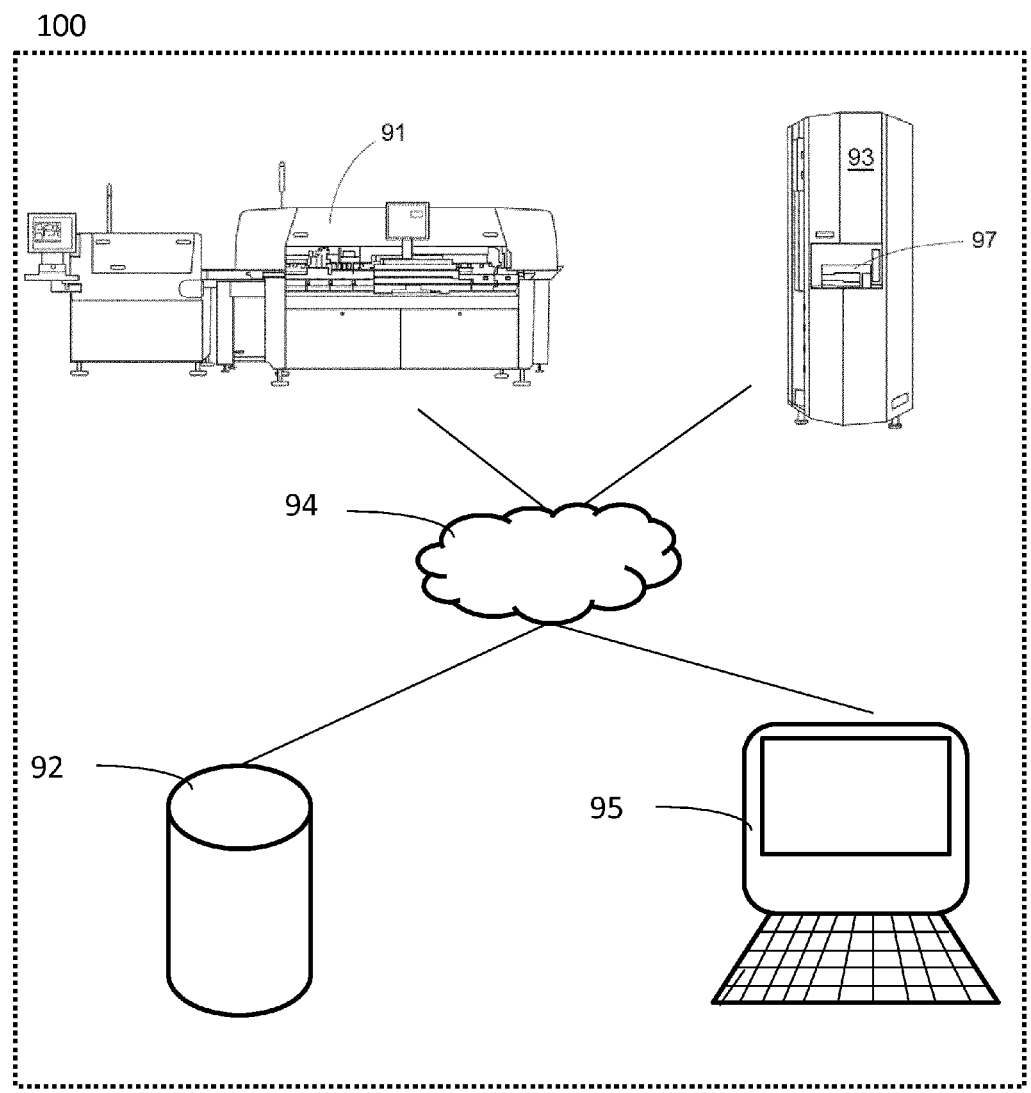
FIG. 1 shows schematically a system for SMT (Surface Mount Technology) semi-automated mounting of electronic components on printed circuit boards.

Background:

The invention relates to Surface Mount Technology (SMT) systems and SMT methods in the field of Surface Mount Technology are the preferred method of automated production of electronic printed circuit boards. Such a system may typically comprise an SMT information database, an SMT pick and place machine, an automated Surface Mount Device (SMD) warehouse and optionally an SMT job planning computing device, wherein all the nodes mentioned above are communicatively coupled, e.g. in a communications network.

SMT pick and place machines for pick-and-place mounting of components on a substrate, such as a Printed Circuit Board (PCB), or a substrate for a System in Package (SiP) component are subject to different, often contradictory demands, such as mounting speed, mounting precision, size, prize, etc. The expression "pick and place" is understood by the person skilled in the art as describing the very mounting operation where a mounting head in said SMT pick and place machine is moved to a component feeder area, where the mounting head picks one or more components from one or more of the component feeders located at predetermined component feeder positions at the pick and place machine, and then is moved to a mounting area where the mounting head places the component or components on the substrate. The total task of placing all required components to a predetermined number of substrates is referred to as producing an SMT job. The SMT job typically comprises SMT job data descriptive of all required components, the position of each component on a substrate required to produce SMT production units, such as electronic printed circuit boards, and the planned relative order the SMT job should be produced in, e.g. third in order to be produced out of five planned SMT jobs.

A typical workflow in a SMT system, as the one described above, is that a planning user plans an SMT job to be executed, stores said SMT job in an SMT information database, an SMT operator, i.e. a human being, retrieves required components from said automated Surface Mount Device (SMD) warehouse and substrates from separate storage or from said automated Surface Mount Device (SMD) warehouse, transfers required components, e.g. placed on component tape reels, to the pick and place machine and loads predetermined component feeder positions at the pick and place machine, e.g. magazines or trolleys, of said SMT pick and place machine and start SMT production of SMT production units, i.e. substrates with SMT components placed thereupon.

The loading of predetermined component feeder positions at the pick and place machine, e.g. magazines, in said SMT pick and place machine with individual component tape reels may be time consuming and introduces risks of erroneous loading of the magazines.

The methods and systems in the technology disclosed describes an automated accumulator device, or automated Surface Mount Device (SMD) warehouse or storage unit, which is adapted to, based on input data received from an operator, retrieved or received from said SMT information database, receive bins, at an input port and automatically store bins in the automated SMD warehouse as well as to retrieve stored bins and present them at an output port. The bins may comprise or are pre-loaded with bin load units in compartments or slots of the bin. The bin load units comprise at least a component tape reel loaded with component tape. The automated Surface Mount Device (SMD) warehouse or storage unit is further adapted to, during idle periods when the automated Surface Mount Device (SMD) warehouse is not occupied with storing or retrieving bins, automatically redistribute bin loading units within a bin or between two or more stored bins. The automated Surface Mount Device (SMD) warehouse might further be adapted to automatically redistribute bins between storage positions within said automated Surface Mount Device (SMD) warehouse.

In certain aspects of the technology disclosed, automatic redistribution may be performed according to certain conditions applied to input data received from an operator or retrieved from said SMT information database, such as component requirements of upcoming SMT jobs. The automatic redistribution may also be performed based on frequency of component use or maximum storage capacity.

The disclosed invention thereby solves the problem of reducing load time of the SMT pick and place machine, when transferring components from the automated Surface Mount Device (SMD) warehouse to the SMT pick and place machine as well as reducing storage time when returning components from the SMT pick and place machine to the automated Surface Mount Device (SMD) warehouse. A further advantage of the invention is to reduce the risk of erroneous loading of the SMT pick and place machine as a preconfigured bin comprising component tape reels with components, adapted to the upcoming SMT job, is placed in the SMT pick and place machine and/or magazine without having the operator loading the bin with bin load units.

Definitions or Clarifications

Surface-mount technology (SMT) is in this document to be understood as technology for assembling and mounting SMT production units, e.g. by placing SMT components on a substrate, such as a Printed Circuit Board (PCB), or a substrate for a System in Package (SiP).

SMT production is in this document to be understood as producing or assembling SMT production units, e.g. by placing SMT components contained in bin load units on a substrate, where in started SMT production involves at least feeding components from bin load units, such as component tape reels, to an SMT pick and place machine.

SMT system in this document may typically comprise an SMT information database, an SMT pick and place machine, an automated Surface Mount Device (SMD) warehouse and optionally an SMT job planning computing device, further detailed in FIG. 1, wherein all the nodes mentioned above are communicatively coupled, e.g. in a wired or wireless communications network. The communication method may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX), optical communication, infrared communication and ultrasonic communication, etc., but is not limited thereto.

SMT components or Surface-mount devices (SMD) is in this document to be understood as units to be placed on a substrate by the SMT system, in particular components, such as electronic components, adapted to be assembled or mounted by a SMT system. This may comprise electronic components or any other component used by the SMT system to produce an SMT production unit. The SMT components are usually delivered to a SMT pick and place machine in either paper/plastic/metallic pocket-tape, with a thin cover tape closing the pockets, wound on reels, in plastic tubes or in static-free trays whereby the SMT pick and place machine places the SMT components on said substrate to produce an SMT production unit. Non-limiting examples of SMT components are capacitors, resistors, diodes or integrated circuits (IC).

SMT component placement systems or SMT pick-and-place machines is in this document to be understood as robotic machines which are used to place SMT components onto a substrate. The SMT components, carried by tapes wound up on component tape reels, are placed in predetermined component feeding positions, e.g. magazines, in the pick and place machine. Pick and place machines are used for high speed, high precision placing of broad range of SMT components. An SMT component feeder or Tape guide feeds or advances the component tape in the form of a pocket tape from the component tape reel and removes a thin cover tape closing the pockets. The feeder/tape guide might utilize internal or external drive to feed the pocket tape. The pick and place mounting head(s) is typically adapted with nozzles for rapidly picking up components out of their pockets in the pocket tape, where said pick-up action is performed at each of the component tape reels/pocket tapes respective pick-up positions in the pick-and-place machine, and place them on the substrate. Information such as substrate positions and types of SMT components, previous to initiation of the assembly and mounting by the pick and place machine, is generated, planned or determined by a planning user on a SMT job planning computing device, together with the number of SMT production units to be produced, and stored as information in a SMT information database in the form of an SMT job. Multiple SMT jobs might be planned and ordered in a SMT job list, also referred to as upcoming SMT jobs, stored in said SMT information database.

SMT component feeder or tape and reel feed mechanism is in this document to be understood as an arrangement through which the component tape is threaded. The SMT feeder is attached to or mounted on the pick and place machine and is adapted to feed or advance the pocket tape from the component tape reel and to remove a thin cover tape closing the pockets. The SMT component feeder may have a built-in tape advancing mechanism or utilize a tape advancing mechanism of the pick and place machine and/or the magazine (this type of passive component feeder without a built-in tape advancing mechanism or other driving/feeding means/mechanisms that utilizes a tape advancing mechanism of the pick-and-place machine and/or the magazine for guiding/feeding the component tape to its pick-up position in the pick-and-place machine is typically referred to as a "tape guide"), e.g. a feeding wheel or a protrusion utilizing an internal or external drive such as a linear motor, in the pick-and-place machine or magazine protrudes through the tape guide into contact with the pre-threaded tape. The SMT component feeder, or tape guide, might be adapted to comprise an SMT feeder ID that might be stored and associated to other identities in said SMT information database, e.g. associated to a component tape reel ID. The technology disclosed in this document also enables that the SMT component feeder or tape guide also may be adapted to comprise an SMT feeder ID that might be stored and associated to identities of other types of units such as bin IDs or pallet IDs of said SMT system, and where the bin IDs or pallet IDs also may be stored as IDs in an SMT information database.

SMT job planning computing device is in this document to be understood as a computing device comprising a processor, a memory, a user input/output interface and a communication interface adapted to receive user input as data, present data to said user, store data to memory, retrieve data from memory and send data to an external unit, e.g. the SMT information database. The SMT job planning computing device may be configured and used to plan and optimize one or a plurality of upcoming SMT jobs, e.g. the order of upcoming SMT jobs, the order of loading of SMT feeders, or tape guides, into the pick and place machine etc.

SMT information database is in this document to be understood as a node adapted to receive information data via an external communication interface, such as a communication network, to store said data in memory, to receive a request for information, to retrieve data from memory based on said request and to send data via said external communication interface to a requesting node. Examples information stored in the database may be SMT component location on a substrate, type of SMT component, the number of produced substrates with placed SMT components, SMT job ID, identities of component tape reels, pallets and bins and association information, e.g. linking a component tape reel ID to a feeder ID. In certain aspects of the technology disclosed, a component tape reel ID may be linked to a pallet ID or a component tape reel ID to a bin ID. The SMT information database might in aspect of the technology disclosed be implemented as a relational database, a dBASE database, an object oriented database, NewSQL database or NoSQL database such as an XML database.

Figure 2:
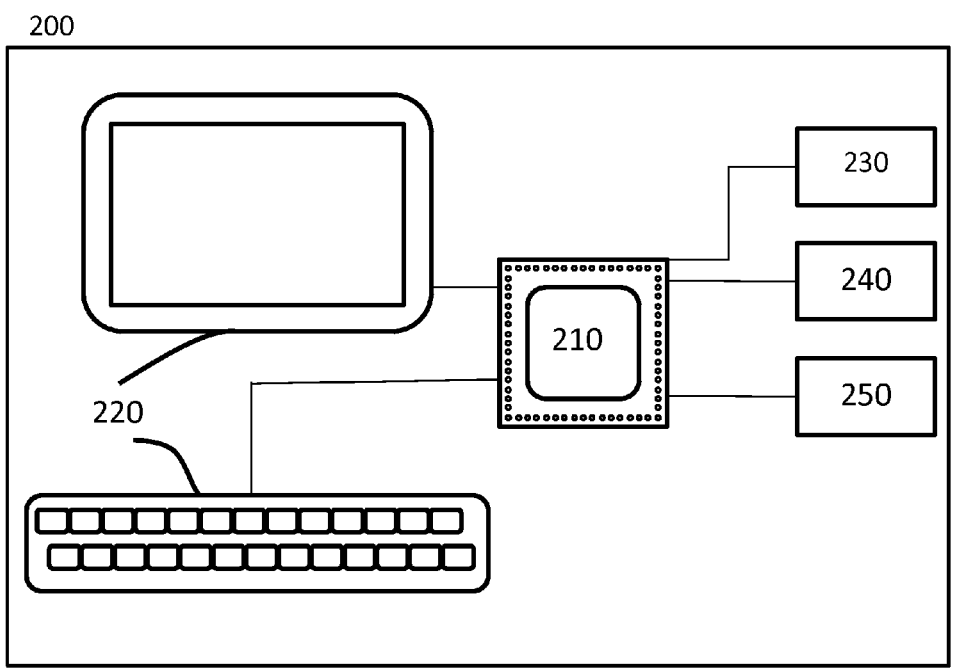
FIG. 2 shows an automated surface mount device (SMD) warehouse device.

Automated surface mount device (SMD) warehouse is in this document to be understood as an automatic robotic storage unit comprising a user input/output device 220, an external communication interface 240, a processor 210, and an actuator 250, further detailed in FIG. 2. The input/output device 220 is adapted to receive user indications as user indication data and to send the user indication data to a processor. The input/output device 220 is further adapted to receive user indication data from a processor and present the data to a user, e.g. by the use of indication means such as light emitting diodes or displays. The external communication interface 240 is adapted to receive data as a signal from a processor and to send said data as a signal to external units, such as the SMT information database. The external communication interface 240 is further adapted to receive data as a signal from external units, such as the SMT information database, and to send said data to said processor. The memory 230 is adapted to receive data as a signal from a processor and to store said data. The memory 230 is further adapted to retrieve data and to send said data as a signal to said processor. The processor 210 is adapted to receive input data, wherein said input data may be received from an operator or retrieved as information from the SMT information database, and to control the actuator 250.

In the technology disclosed, the actuator 250, e.g. a mechanical hand or robot arm, is adapted to be controlled by the processor to receive a bin at an input port of said automated Surface Mount Device (SMD) warehouse, to store said bin at a position within said automated Surface Mount Device (SMD) warehouse and to store said position and alternatively a bin ID, a pallet ID, a component tape reel ID or an SMT feeder ID in memory. The processor is further adapted to control the actuator to retrieve a bin at a position within said automated Surface Mount Device (SMD) warehouse, based on said input data and a position within said automated Surface Mount Device (SMD) warehouse retrieved from memory, and to present said retrieved bin at an output port of said automated Surface Mount Device (SMD) warehouse.

In the technology disclosed, the automated Surface Mount Device (SMD) warehouse or storage unit may further be configured to automatically redistribute bin loading units within a bin or between two or more stored bins, e.g. for replenishment purposes when the automated Surface Mount Device (SMD) warehouse concurrently is occupied with storing or retrieving bins or for optimization of upcoming SMT jobs or storage space in the Surface Mount Device (SMD) warehouse during idle periods when the automated Surface Mount Device (SMD) warehouse is not occupied with storing or retrieving bins. The automatic redistribution may be performed according to certain conditions applied to input data received from an operator or retrieved from said SMT information database, such as component requirements of upcoming SMT jobs. The automatic redistribution may also be performed based on frequency of component use or maximum storage capacity. As an example a bin or multiple bins might be loaded with component tape reels required for producing the next SMT job.

In the technology disclosed, a plurality of automated Surface Mount Device (SMD) warehouse may be configured to form an integrated automated Surface Mount Device (SMD) warehouse cluster, wherein a bin with bin load units may be redistributed between a first and a second automated Surface Mount Device (SMD) warehouse via a port shared between the two automated SMD warehouses, via a first opening in the first automated Surface Mount Device (SMD) warehouse and/or a second opening in the first second automated Surface Mount Device (SMD) warehouse, wherein a first actuator in the first automated Surface Mount Device (SMD) warehouse is configured to grip a bin with a plurality of bin load units or a single bin load unit in the second opening and a second actuator in the second automated Surface Mount Device (SMD) warehouse is configured to grip a bin or bin load unit in the first opening such that bin load units can be passed from said first Surface Mount Device (SMD) warehouse and said second Surface Mount Device (SMD) warehouse.

In the technology disclosed, the plurality of automated Surface Mount Device (SMD) warehouse may be configured to form an integrated automated Surface Mount Device (SMD) warehouse cluster, where said cluster is configured to retrieving and presenting a bin (adapted to hold/carry at least two bin load units) stored in a first automated Surface Mount Device (SMD) warehouse, and where said cluster is further configured to redistributing the bin from a first to a second of said automated Surface Mount Device (SMD) warehouses of said cluster via a port or opening shared between at least two of the automated SMD warehouses of the cluster (where at least one of the at least two of the automated SMD warehouses is either said first or said second SMD warehouse), and where the cluster is further configured to presenting the bin at an output port of said second automated Surface Mount Device (SMD), wherein either a first actuator in the first automated Surface Mount Device (SMD) warehouse or a second actuator in the second automated Surface Mount Device (SMD) warehouse is further configured to, prior to presenting the bin at the output port of said second automated Surface Mount Device (SMD), gripping and redistributing the bin by transferring said bin through the port or opening shared between the at least two of the automated SMD warehouses of the cluster.

In the technology disclosed, the automated Surface Mount Device (SMD) warehouse or storage unit (or cluster of plurality of automated Surface Mount Device (SMD) warehouses or storage units) may further be configured to store bins with a small physical volume, e.g. adapted to hold two bin load units as is further described in relation to FIG. 7.

In the technology disclosed, the automated Surface Mount Device (SMD) warehouse or storage unit (or cluster of plurality of automated Surface Mount Device (SMD) warehouses or storage units) may itself have a large physical volume and may further be configured to store bins with a large physical volume, wherein the bins may be configured with wheels to form a trolley, e.g. where each bin/trolley is adapted to hold multiple bin load units or even adapted to hold a plurality of baskets each with compartments or slots adapted to hold multiple bin load units. The bins or trolleys, which in this aspect of the technology disclosed are adapted to be stored in an automated SMD warehouse or cluster of automated SMD warehouses having a large physical volume, may further be configured to hold a plurality of SMT component feeders or tape guides, with or without a driving/feeding mechanism, where the bin/trolley is further be positioned in an SMT pick and place machine 91 for immediate operation and further be configured to feed the components of the component tape reels directly to the pick-up positions associated with a SMT pick and place machine 91, where said SMT component feeders or tape guides may have a built-in tape advancing mechanism or utilize a tape advancing mechanism of the pick and place machine or the magazine (tape guide), e.g. a feeding wheel or a protrusion utilizing an internal or external drive such as a linear motor.

Pallet is in this document to be understood as an accumulator device for electronic components comprised on a component tape reel and adapted with an attachment arrangements allowing storage in a bin, a position in an automated Surface Mount Device (SMD) warehouse and position in an SMT pick and place machine, as would be understood by a person skilled in the art.

Bin is in this document to be understood as an basket, trolley or accumulator adapted to comprise packet units of component tape reels and optional SMT feeder/tape guide, pallets or any component handled by an SMT pick and place machine in one or more slots or compartments and adapted with an attachment arrangement allowing storage in a position in an automated Surface Mount Device (SMD) warehouse and an SMT pick and place machine, as would be understood by a person skilled in the art. Alternatively, the bin comprises a bin identity tag, e.g. attached to the bins forward facing surface such that the surface is facing an operator, wherein said identity tag comprises an alphanumerical display controller unit and an alphanumerical display. The alphanumerical display controller can optionally recognize and register bin load units placed in the bin, e.g. by scanning barcodes or RFID tags attached to the bin load units. The scanning may be performed manually by a handheld barcode tag/RFID tag scanner or by a barcode tag/RFID tag scanner integrated in the bin. Alternatively the alphanumerical display controller is configured to communicate data, e.g. identities of recognize and register bin load units, via the communications network to the SMT information database, e.g. such that information on the content of the bin is available in the SMT information database. Alternatively, the bin is further configured with wheels to form a trolley such that the bin can be retrieved manually or automatically from an automated Surface Mount Device (SMD) warehouse 93 and positioned in an SMT pick and place machine 91 for immediate operation. Alternatively, the bin is configured to facilitate block-handling of bin load units such that components can be fed directly into the SMT pick and place machine 91 when the bin load units are placed in the bin, e.g. by configuring the bin to hold SMT feeders mounted on the bin positioned to feed components directly into the SMT pick and place machine 91. Alternatively, wherein the bin load unit comprises an SMT feeder and wherein the alphanumerical display controller is configured to receive data via the communications network from the SMT information database, wherein the data comprises bin load unit related data such as pickup offset and component tape pitch.

Systems

FIG. 1 shows a schematically view of an SMT system 100 comprising an SMT information database 92, an SMT pick and place machine 91, an automated Surface Mount Device (SMD) warehouse 93 comprising a port or opening for presenting bins 97, and optionally an SMT job planning computing device 95, further detailed in FIG. 1, wherein all the nodes mentioned above are communicatively coupled in a communications network 94. The communications network may include at least one of a Local Area Network (LAN), Metropolitan Area Network (MAN), Global System for Mobile Network (GSM), Enhanced Data GSM Environment (EDGE), High Speed Downlink Packet Access (HSDPA), Wideband Code Division Multiple Access (W-CDMA), Code Division Multiple Access (CDMA), Time Division Multiple Access (TDMA), Bluetooth®, Zigbee®, Wi-Fi, Voice over Internet Protocol (VoIP), LTE Advanced, IEEE802.16m, WirelessMAN-Advanced, Evolved High-Speed Packet Access (HSPA+), 3GPP Long Term Evolution (LTE), Mobile WiMAX (IEEE 802.16e), Ultra Mobile Broadband (UMB) (formerly Evolution-Data Optimized (EV-DO) Rev. C), Fast Low-latency Access with Seamless Handoff Orthogonal Frequency Division Multiplexing (Flash-OFDM), High Capacity Spatial Division Multiple Access (iBurst®) and Mobile Broadband Wireless Access (MBWA) (IEEE 802.20) systems, High Performance Radio Metropolitan Area Network (HIPERMAN), Beam-Division Multiple Access (BDMA), World Interoperability for Microwave Access (Wi-MAX) and ultrasonic communication, infrared networks etc., but is not limited thereto.

FIG. 2 shows a schematic view of an automated Surface Mount Device (SMD) warehouse 200 adapted to obtain information related to upcoming SMT jobs, to store bins at predetermined positions within said automated Surface Mount Device (SMD) warehouse. The automated Surface Mount Device (SMD) warehouse further comprises a processor/processing unit 210 provided with specifically designed programming or program code portions adapted to control the processing unit to perform the steps and functions of aspect of the technology disclosed of the inventive method described herein. The automated Surface Mount Device (SMD) warehouse further comprises at least one memory 230 configured to store data values or parameters received from a processor 210 or to retrieve and send data values or parameters to a processor 210. The automated Surface Mount Device (SMD) warehouse further comprises a communications interface 240 configured to send or receive data values or parameters to/from a processor 210 to/from external units via the communications interface 240. The automated Surface Mount Device (SMD) warehouse further comprises an actuator 250, such as a robot or robotic arm, adapted to retrieve/store bins, pallets or component tape reels at predetermined positions within the automated Surface Mount Device (SMD) warehouse based on control data received from said processor.

The processor/processing unit 210 may be a processor such as a general or specific purpose processor/processing unit for example a microprocessor, microcontroller or other control logic that comprises sections of code or code portions, stored on a computer readable storage medium, such as a memory 230, that are fixed to perform certain tasks but also other alterable sections of code, stored on a computer readable storage medium, that can be altered during use. Such alterable sections of code can comprise parameters that are to be used as input for the various tasks, such as displaying or processing HTML content or any other parameter related operations known to a person skilled in the art and applied without inventive skill.

The processor/processing unit 210 may be configured to be communicatively coupled and communicate with a memory 230 where data and parameters are kept ready for use by the processing unit 210. The one or more memories 230 may comprise a selection of a hard RAM, disk drive, a floppy disk drive, a magnetic tape drive, an optical disk drive, a CD or DVD drive (R or RW), or other removable or fixed media drive.

Method and Further Systems of the Technology Disclosed

When producing SMT production units in an SMT system a SMT job associated with an SMT production unit is planned or predefined and stored in an SMT information database. Information relating to an SMT job might indicate the number of production units to be produced and component requirements to complete production of the SMT unit by an SMT pick and place machine. In conventional systems this involves retrieving individual component rolls carrying SMT components, transporting and inserting them in a component feeding position at the pick and place machine, where they can provide components to the pick and place machine robot. The invention reduces the complexity and error-prone previous process by providing pre-loaded bins, trays or accumulator devices that are automatically retrieved from the automated Surface Mount Device (SMD) warehouse and presented at a port, slit, outlet or access point to the operator of the pick and place machine and can be inserted directly into the pick and place machine for the upcoming SMT job. As the bins have been pre-loaded with components required at the upcoming SMT job, less actions and preparation steps are required by the operator. Information relating to upcoming SMT jobs are obtained, e.g. retrieved from memory, pushed or sent by the SMT information database over a communications network, retrieved over a communications network from the SMT information database or obtained from operator indications to an input/output device of the automated Surface Mount Device (SMD) warehouse. Examples of input data received by the automated Surface Mount Device (SMD) warehouse are SMT job ID, SMT job component requirements, bin ID, pallet ID, component tape reel ID or a parameter representing position in the automated Surface Mount Device (SMD) warehouse, or a position within the cluster of automated SMD warehouses the automated SMD warehouse is an integrated part of.

Figure 6:
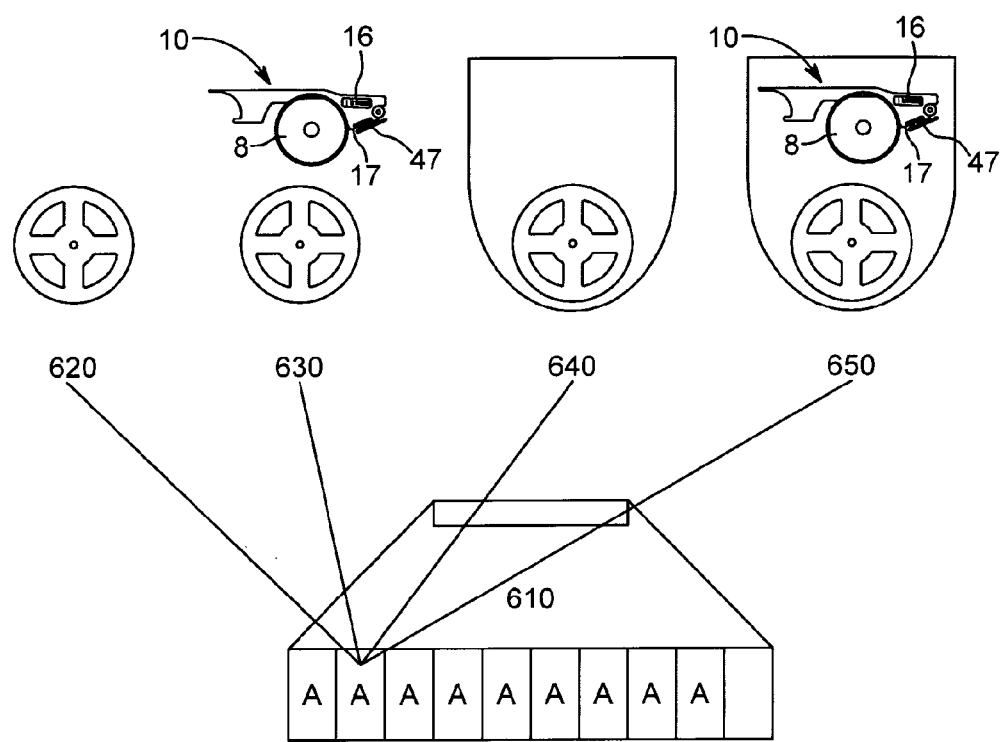
FIG. 6 shows various examples of bin load units, such as component tape reel, component tape reel with feeder, a pallet comprising a component tape reel and a pallet comprising a component tape reel and an SMT component feeder/tape guide.

FIG. 6 shows various examples of bin load units comprised in a bin 610, such as a component tape reel 620, a component tape reel with SMT feeder or tape guide 630, a pallet comprising a component tape reel 640 and a pallet comprising a component tape reel and an SMT feeder 650. The bin 610 may comprise one or a plurality of compartments or slots adapted to comprise bin load units. The SMT feeder 650 may have a built-in tape advancing mechanism or utilize a tape advancing mechanism of the pick and place machine or the magazine, e.g. a feeding wheel or a protrusion utilizing an internal or external drive such as a linear motor, in the pick-and-place machine or magazine, that protrudes through the tape guide into contact with the pre-threaded tape.

Figure 7A:
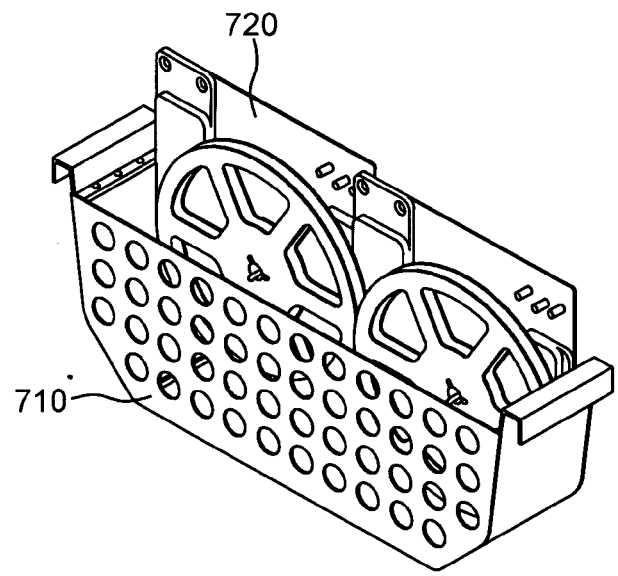
FIG. 7 shows an example of a bin comprising bin load units in the form of pallets comprising component tape reels.
Figure 7B:
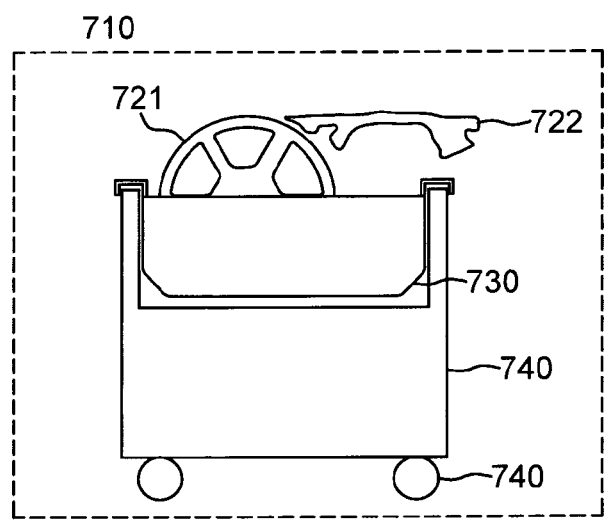

FIG. 7a shows an example of a bin 710 comprising bin load units 720 in the form of pallets comprising component tape reels. FIG. 7b shows yet an example of a bin 710 configured as a trolley. The bin 710 is loaded with a bin load unit consisting of a component tape reel 721 and a SMT feeder or tape guide 722. The bin 710 further comprises a first compartment section 730 adapted to comprise bin load units and a second chassis section 740 configured to roll on a supporting surface, such as a floor, such that the bin can be moved back and forth between the SMD warehouse and the Pick-and-Place Machine, be retrieved/stored by an actuator in an automated SMD warehouse and to be inserted directly into the pick and place machine for producing the upcoming SMT job. In one embodiment the first compartment section 730 and the second chassis section 740 is configured as an integral non-separable part. In yet another embodiment the first compartment section 730 and the second chassis section 740 is configured as an separable parts such that the first compartment section 730 can be separated from the second chassis section 740 and stored separately in an automated SMD warehouse or inserted separately in an SMT pick and place machine.

Figure 11:
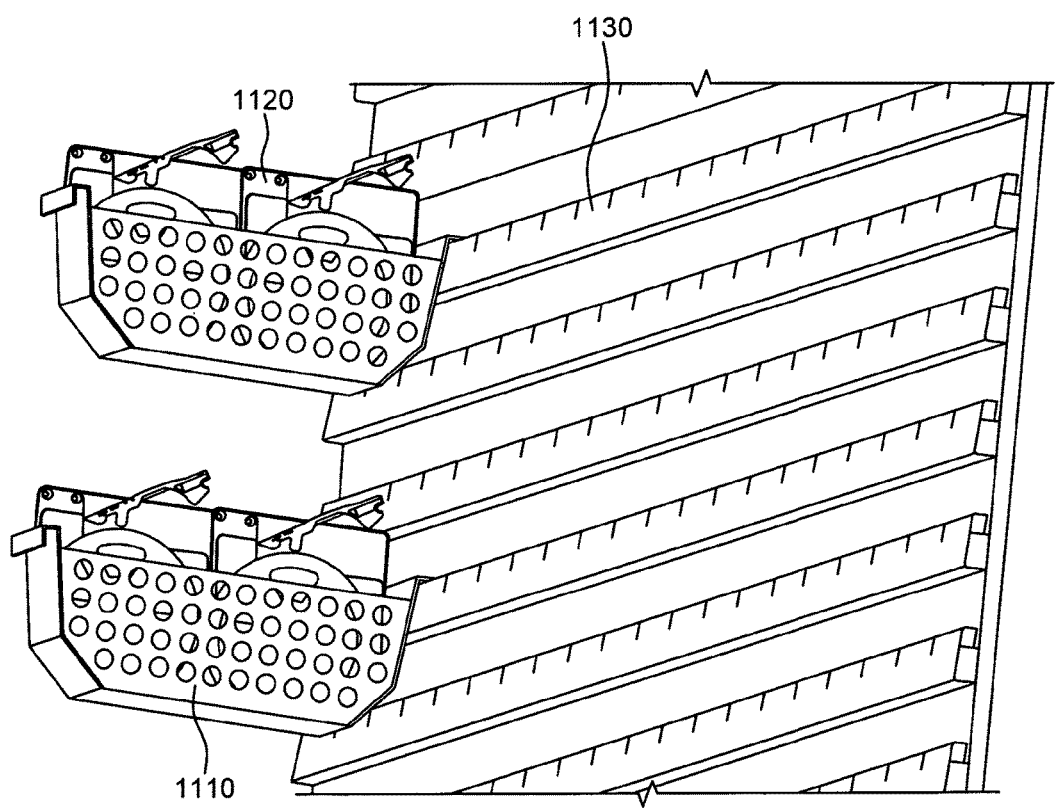
FIG. 11 shows an example of the technology disclosed where a first and a second bin are retrieved from, or stored in, predetermined storage positions in the automated Surface Mount Device (SMD) warehouse.

FIG. 11 shows an example of the technology disclosed where a first 1110 and a second bin 1120 are retrieved from, or stored in, predetermined storage positions 1130 in the automated Surface Mount Device (SMD) warehouse. The attachment of a bin to the storage position might be performed by a hook, an element protruding through a hole, by magnetic means or any other attachment means known to a skilled person.

Figure 15A:
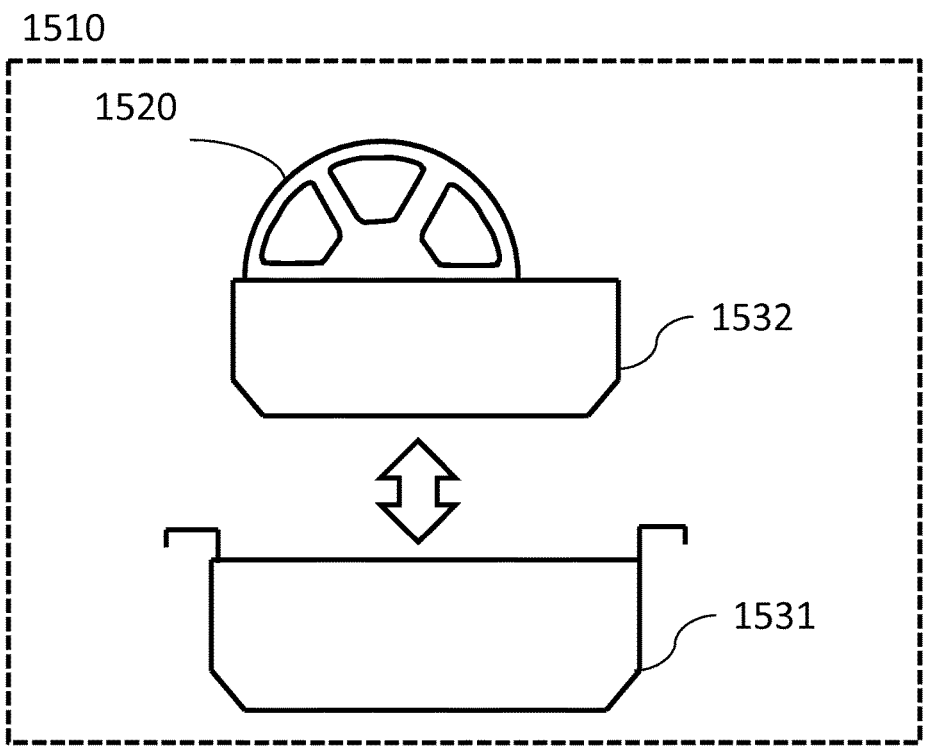
FIGS. 15a and 15b shows an example of a bin comprising bin a bin load unit compartment section and a receptacle compartment section.
Figure 15B:
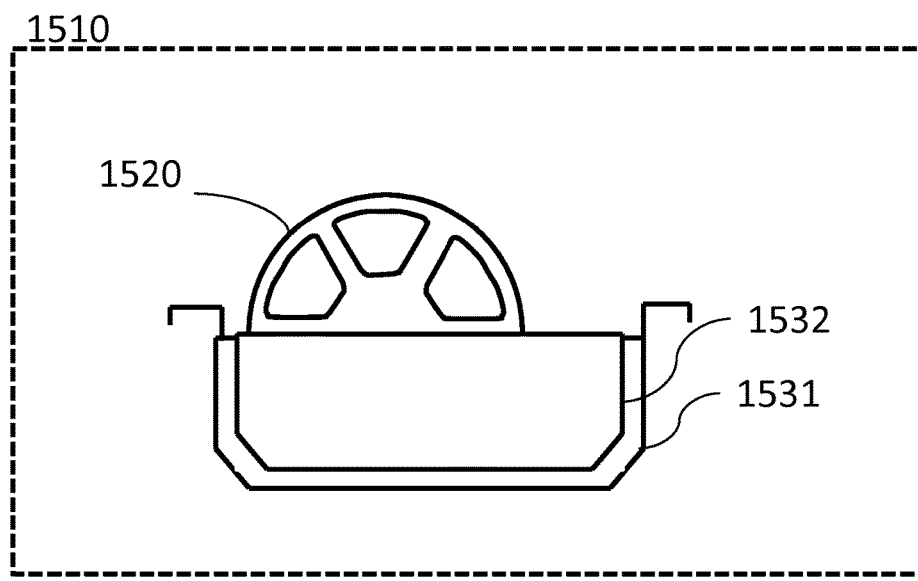

FIG. 15*a* shows an example of a bin 1510 comprising bin load units 1520 in the form of component tape reels. The bin 1510 is further configured to comprise a third bin load unit compartment section 1532 adapted to comprise bin load units 1520 and a fourth receptacle compartment section 1531 adapted to comprise said third load unit compartment section 1532. The third bin load unit compartment section 1532, can be separated from the fourth receptacle compartment section 1531 and inserted back into the fourth receptacle compartment section 1531 at a later time. The bin 1510 comprising a third load unit compartment section 1532 inserted into the fourth receptacle compartment section 1531 can be inserted directly into the pick and place machine for producing the upcoming SMT job. By replacing the third load unit compartment section 1532 with a different one, e.g. a third load unit compartment section 1532 configured to receive component trays, component sticks or component tape reels, the bin can be more easily reconfigured to be loaded with different type of components depending on requirements of an SMT job. An advantage is that the delay when configuring a pick and place machine for an upcoming SMT job can be reduced. Yet another advantage is that the same fourth receptacle compartment section 1531 can be used for various components by changing the third load unit compartment section 1532

Storage and Handling of Electronical Components

Figure 3:
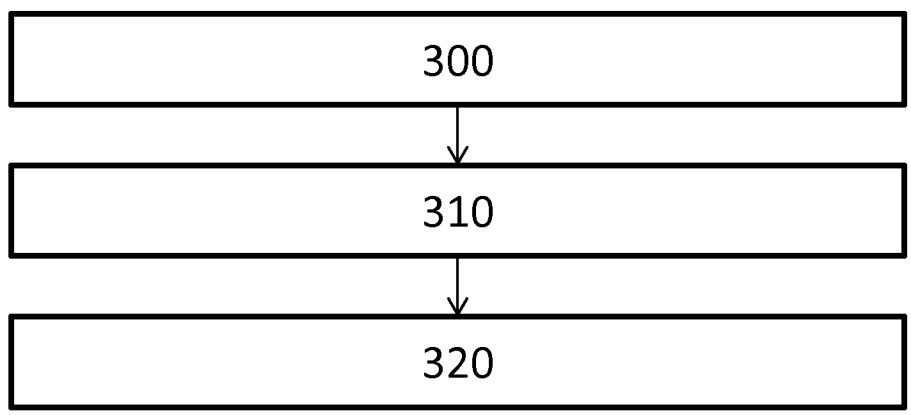
FIG. 3 shows a method in Surface-mount technology (SMT) system for presenting a retrieved bin at a port of an automated Surface Mount Device (SMD) warehouse.

FIG. 3 shows an example of the technology disclosed in the form a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse, wherein said bins are adapted to comprise bin load units, wherein said bin load unit comprises at least a component tape reel, the method comprising:

300: receiving input data;

310: retrieving a bin based on said input data and a parameter representing a position within said automated Surface Mount Device (SMD) warehouse, wherein said bin is adapted to comprise a multiple of bin load units, where each of said bin load units constitute or comprise at least a component tape reel.

320: presenting said retrieved bin at a port of said automated Surface Mount Device (SMD) warehouse.

In yet another aspect of the technology disclosed, there is provided a method in an automated Surface Mount Device (SMD) warehouse adapted to obtain information related to upcoming SMT jobs, to store bins at predetermined positions within said automated Surface Mount Device (SMD) warehouse and to retrieve bins at predetermined positions within said automated Surface Mount Device (SMD) warehouse, wherein said bins are adapted to comprise bin load units, wherein said bin load unit comprises at least a component tape reel, the method comprising:

receiving at least one of input data and a parameter representing a position within said automated Surface Mount Device (SMD) warehouse;

retrieving a bin loaded with a plurality of bin load units from said position within said automated SMD warehouse at least partly based on said at least one of input data and/or a parameter representing said position within said automated Surface Mount Device (SMD) warehouse; and presenting said retrieved bin at, or close to, an output port, such as an opening, of said automated Surface Mount Device (SMD) warehouse.

In one non-limiting example input data descriptive of set of components, component 1, component 2, component P, is received 300. A bin is retrieved based on said input data and a parameter representing a position within said automated Surface Mount Device (SMD) warehouse. In one example, the parameter may be comprised in a data structure stored in the SMD warehouse, such as a table, descriptive of a component tape identity, bin identity or pallet ID and a position within said SMD e.g.:

| Identity | X position | Y position | Z position |
|---|---|---|---|
| component tape identity 1 | X1 | Y1 | Z1 |
| component tape identity 2 | X2 | Y2 | Z2 |
| component tape identity 3 | X3 | Y3 | Z3 |
| component tape identity 4 | X4 | Y4 | Z4 |

In one example, the parameter may be comprised in a data structure, such as a table, descriptive of a component tape identity, bin identity or pallet ID and a position within said SMD e.g.:

| Identity | Shelf ID |
|---|---|
| component tape identity 1 | S1 |
| component tape identity 2 | S2 |
| component tape identity 3 | S3 |
| component tape identity 4 | S4 |

The X, Y, Z position or the shelf ID is obtained by performing a look-up in the parameter table on the input data to obtain the position within said automated SMD warehouse, e.g. (X1,Y1,Z1) or (Shelf 34). The bin or bins located at the obtained position within said automated SMD warehouse is then retrieved and presented at a port of said automated Surface Mount Device (SMD) warehouse.

The automated Surface Mount Device (SMD) warehouse may further comprise an input/output interface and said input data is received from said input/output interface based on an operator indication of an upcoming SMT job.

In one example, an operator enters the identity of an upcoming SMT job, the automated Surface Mount Device (SMD) warehouse retrieves or receives the identities of components associated with, comprised in or required in the upcoming SMT job from said SMT information database, such as component tape reel identity or pallet identity. The X, Y, Z position or the shelf ID is obtained by performing a look-up in the parameter table on the retrieved or received identities of components to obtain the position within said automated SMD warehouse, e.g. (X1,Y1,Z1) or (Shelf 34). The bin or bins located at the obtained position within said automated SMD warehouse is then retrieved and presented at a port of said automated Surface Mount Device (SMD) warehouse.

In one or more examples of the technology disclosed, said input data is received or retrieved from an SMT information database and said input data is associated with or is indicating an upcoming SMT job.

In one example, the input data descriptive of an upcoming SMT job is pushed by or received from the SMT information database via the communications network, the automated Surface Mount Device (SMD) warehouse retrieves or receives the identities of components associated with, comprised in or required in the upcoming SMT job from said SMT information database, such as a component tape reel identity or pallet identity. The X, Y, Z position or the shelf ID is obtained by performing a look-up in the parameter table on the retrieved or received identities of components to obtain the position within said automated SMD warehouse, e.g. (X1,Y1,Z1) or (Shelf 34). The bin or bins located at the obtained position within said automated SMD warehouse is then retrieved and presented at a port of said automated Surface Mount Device (SMD) warehouse.

In one or more examples of the technology disclosed, said parameter is representing a position within said automated Surface Mount Device (SMD) warehouse and is retrieved from a memory in said automated Surface Mount Device (SMD) warehouse.

In one example the parameter representing a position within said automated Surface Mount Device (SMD) warehouse is an X, Y, Z position or the shelf ID and is obtained or retrieved by performing a look-up in a parameter table based on the retrieved or received identities of components to obtain the position within said automated SMD warehouse, e.g. (X1,Y1,Z1) or (Shelf 34).

The method of claim 1, wherein retrieving a bin is performed based on an upcoming SMT job, wherein the SMT job comprises data indicative of required components in said upcoming SMT job, wherein said bin has been pre-loaded with bin load units based on said SMT job.

In one example the actuator in the automated SMD warehouse have pre-loaded the bin based on a subset of required components or bill-of-materials in an upcoming SMT job by automatically redistributing stored bin load units in said automated Surface Mount Device (SMD) warehouse based on at least one of SMT job related information received or retrieved from said SMT database.

After finishing an SMT job the operator unloads the bin from the pick and place machine and returns it to the port of the automated Surface Mount Device (SMD) warehouse, that in turn receives the bin and stores it at an available position or storage position within the automated Surface Mount Device (SMD) warehouse by the use of one or more actuators, such as a robot, robot arm or other actuator known to a skilled person.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins are adapted to comprise bin load units, wherein said bin load unit comprises at least a component tape reel, the method comprising:
receiving a bin at a port, such as an opening, of said automated Surface Mount Device (SMD) warehouse;
storing said bin at a position within said automated Surface Mount Device (SMD) warehouse;
store said position.

In yet another example of the technology disclosed provides for a method in an automated Surface Mount Device (SMD) warehouse adapted to obtain information related to upcoming SMT jobs, to store bins at predetermined positions within said automated Surface Mount Device (SMD) warehouse, wherein said bins are adapted to comprise bin load units, wherein said bin load unit comprises at least a component tape reel, the method comprising:
receiving a bin at an input port, such as an opening, of said automated Surface Mount Device (SMD) warehouse;
determining tape reel identities of component tape reels comprised in said bin;
storing said bin at one of said plurality of positions within said automated Surface Mount Device (SMD) warehouse, wherein said bin is comprising a plurality of bin load units, and wherein each of said plurality of bin load units is comprising or constituting a component tape reel.

In one example, an operator provides a bin comprising bin load units at the port of said automated Surface Mount Device (SMD) warehouse. The bin load units in the bin are identified, e.g. by scanning an identity tag or retrieving associated bin load units from the SMT information database. The processor in the automated Surface Mount Device (SMD) warehouse identifies an available position within said automated Surface Mount Device (SMD) warehouse that could accommodate the bin and retrieves the corresponding parameter value from memory. The actuator then stores the received bin at the retrieved position within said automated Surface Mount Device (SMD) warehouse and stores the position within said automated Surface Mount Device (SMD) warehouse associated to bin load unit IDs comprised in the bin in the memory and/or the SMT information database, where bin load unit IDs are e.g. component tape reel IDs or pallet IDs.

In yet another aspect of the technology disclosed, storing said bin further comprises:
determining tape reel identities of component tape reels comprised in said bin;

In one example, determining tape reel identities comprise scanning an identity tag of component tape reels comprised in said bin, where the identity tags are e.g. barcodes or RFID tags.

In yet another aspect of the technology disclosed, determining tape reel identities of component tape reels comprised in said bin comprises:
scanning individual identity tags attached to component tape reels; and;
store the identity (ID) of each component tape reel to a memory in said automated Surface Mount Device (SMD) warehouse.

In yet another aspect of the technology disclosed, determining tape reel identities of component tape reels comprised in said bin comprises:
scanning individual identity tags attached to component tape reels; and
storing the identity (ID) of each component tape reel scanned and the position of the stored bin to at least one of a memory in said automated Surface Mount Device (SMD) warehouse and/or in an SMT information database.

In one example, the scanning is performed at the input port of the SMD warehouse with the bin load units positioned in the bin.

In yet another aspect of the technology disclosed, determining tape reel identities of component tape reels comprised in said bin further comprises:

gripping said bin load unit comprised in said bin by an actuator comprised in said automated Surface Mount Device (SMD) warehouse;

moving said bin load to an intermediate position within said automated Surface Mount Device (SMD) warehouse;

replacing said bin load unit in said bin.

In one example, the actuator moves the bin load unit into a position where it can be scanned by a fixed identity tag scanner, e.g. a bar code scanner.

In yet another aspect of the technology disclosed, said individual identity tags are barcodes adapted to be scanned by a barcode scanner unit and through said scanning provide information to the barcode scanner unit of an associated identity.

In yet another aspect of the technology disclosed, determining tape reel identities of component tape reels comprised in said bin comprises:

scanning individual identity tags attached to pallets comprising component tape reels to obtain bin IDs, retrieve the ID of component tape reel ID associated to pallet ID from said SMT information database.

In yet another aspect of the technology disclosed, determining tape reel identities of component tape reels comprised in said bin comprises:

scanning, or reading, individual identity tags attached to pallets comprising component tape reels, whereby individual pallet IDs are obtained from said scanning or reading of individual identity tags attached to pallets; and retrieving the ID of component tape reels associated with said obtained pallet IDs from said SMT information database.

In one example, the component tape IDs are associated with respective pallet IDs in the SMT information database, the pallet IDs are obtained by scanning identity tags attached to the pallets and the IDs of component tape reels associated to the scanned pallet ID from said SMT information database using database lookup, as would be understood by a person skilled in the art.

In yet another aspect of the technology disclosed, determining tape reel identities of component tape reels comprised in said bin comprises:

scanning an identity tag attached to said bin to obtain bin IDs;

retrieve the IDs of component tape reel IDs associated to said bin IDs from said SMT information database.

In one example, the component tape IDs are associated with respective bin IDs in the SMT information database, the bin IDs are obtained by scanning identity tags attached to the bins and the IDs of component tape reels associated to the scanned bin ID from said SMT information database using database lookup, as would be understood by a person skilled in the art.

In yet another aspect of the technology disclosed, said identity tag is one of a EAN-13, EAN-8, UPC, Code 39, GS1-128, AI, Code 128, ITF-14, ITF-14, GS1 Datamatrix, GS1 Databar, Industrial 2 of 5, Industrial 2 of 5 Interleaved, 3-DI, ArrayTag, Aztec Code, Small Aztec Code, Codablock, Code 1, Code 16K, Code 49, ColorCode, Color Construct Code, Compact Matrix Code, CP Code, CyberCode, d-touch, DataGlyphs, Data Matrix, Datastrip Code, Dot Code A, EZcode, Grid Matrix Code, HD Barcode, High Capacity Color Barcode, HueCode, INTACTA.CODE, InterCode, JAGTAG, MaxiCode, mCode, MiniCode, MicroPDF417, MMCC, Nintendo e-Reader#Dot code, Optar, PaperDisk, PDF417, PDMark, QR Code, QuickMark Code, Secure Seal, SmartCode, Snowflake code, ShotCode, SPARQCode, SuperCode, Trillcode, UltraCode, UnisCode, VeriCode, VSCode, WaterCode and Radio Frequency Identification (RFID) tags.

In yet another aspect of the technology disclosed, said position is stored as a parameter representing a position within said automated Surface Mount Device (SMD) warehouse.

In one example, wherein said position is an X,Y,Z coordinate or a shelf identity.

In yet another aspect of the technology disclosed, an automated Surface Mount Device (SMD) warehouse system comprising:

a processor;

an actuator communicatively coupled to said processor, such as a robot or robotic arm, adapted to retrieve or store bins, pallets or component tape reels at predetermined positions within the automated Surface Mount Device (SMD) warehouse based on control data received from a processor, a memory wherein said processor is adapted to obtain information related to upcoming SMT jobs, to store bins at predetermined positions within said automated Surface Mount Device (SMD) warehouse by sending control data to said actuator, wherein said bins are adapted to comprise bin load units, wherein said bin load unit comprises at least a component tape reel, wherein said processor in said automated Surface Mount Device (SMD) warehouse adapted to perform the steps of:

receiving input data;

retrieving a bin based on said input data and a parameter representing a position within said automated Surface Mount Device (SMD) warehouse by sending control data to said actuator, wherein said bin is adapted to comprise bin load units, wherein said bin load unit comprises at least a component tape reel;

presenting said retrieved bin by said actuator at a port of said automated Surface Mount Device (SMD) warehouse by sending control data to said actuator In yet another aspect of the technology disclosed, the system further comprising an input/output interface and said input data is received from said input/output interface based on an operator indication of an upcoming SMT job In yet another aspect of the technology disclosed, the system further comprising a communications interface and said input data is received from said SMT information database via a communications network and said input data is associated with (indicating) an upcoming SMT job.

In yet another embodiment, an automated Surface Mount Device (SMD) warehouse comprising:

a processor, and an actuator, such as a robot or robotic arm, communicatively coupled to said processor;

wherein said processor is configured to receiving at least one of input data and a parameter representing a position within said automated Surface Mount Device (SMD) warehouse and to send control data to the actuator at least partly based on the obtained information and/or instructions;

wherein the actuator is configured to retrieve a bin from said position within the automated Surface Mount Device (SMD) warehouse and presenting said retrieved bin at, or close to, an output port, such as an opening, of said automated Surface Mount Device (SMD) warehouse based on control data received from said processor.

Any of the automated SMD warehouses in the technology disclosed and mentioned above and in the claims may further comprise an input/output interface, where said processor mentioned above and in the claims may further be configured to receive input data from said input/output interface based on an operator indication of an upcoming SMT job.

Any of the automated SMD warehouses in the technology disclosed and mentioned above and in the claims, may further comprise a communications interface configured to receive and/or retrieve input data from a SMT information database via a communications network, wherein said processor mentioned above and in the claims may further be configured to receive input data from said communications network, wherein said input data is associated with, or is indicating, an upcoming SMT job.

In yet another aspect of the technology disclosed, an automated Surface Mount Device (SMD) warehouse system comprising:

an actuator, such as a robot or robotic arm, adapted to retrieve or store bins, pallets or component tape reels at predetermined positions within the automated Surface Mount Device (SMD) warehouse based on control data received from a processor, a memory a processor, adapted to to obtain information related to upcoming SMT jobs, to store bins at predetermined positions within said automated Surface Mount Device (SMD) warehouse by sending control data to said actuator, wherein said bins are adapted to comprise bin load units, wherein said bin load unit comprises at least a component tape reel, wherein said processor in said automated Surface Mount Device (SMD) warehouse adapted to perform the steps of:

receiving a bin at a port of said automated Surface Mount Device (SMD) warehouse by controlling said actuator with control data;

storing said bin at a position within said automated Surface Mount Device (SMD) warehouse by said actuator with control data;

store said position

In one or more embodiments, wherein said processor is further adapted to perform any of the steps of the methods described herein In yet another aspect of the technology disclosed, an automated Surface Mount Device (SMD) warehouse system comprising:

an actuator, such as a robot or robotic arm, adapted to retrieve or store bins, pallets or component tape reels at predetermined positions within the automated Surface Mount Device (SMD) warehouse based on control data received from a processor, a memory a processor configured to obtain information related to upcoming SMT jobs;

wherein said actuator is configured to store bins at predetermined positions within said automated Surface Mount Device (SMD) warehouse by receiving control data from said processor, and wherein said bins are adapted to comprise bin load units, wherein said bin load unit comprises at least a component tape reel, and wherein said processor of said automated Surface Mount Device (SMD) warehouse system is further configured to control the steps of:

receiving a bin at a port of said automated Surface Mount Device (SMD) warehouse by providing said actuator with control data; and storing said bin at a position within said automated Surface Mount Device (SMD) warehouse by providing said actuator with said control data.

In the technology disclosed, a plurality of automated Surface Mount Device (SMD) warehouse may be configured to form an integrated automated Surface Mount Device (SMD) warehouse cluster, wherein bin load units may be stored or retrieved by being redistributed between a first and a second automated Surface Mount Device (SMD) warehouse via a first opening in the first automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be passed or redistributed from said first Surface Mount Device (SMD) warehouse to said second Surface Mount Device (SMD) warehouse and vice versa.

In one or more aspects of the technology disclosed, said first Surface Mount Device (SMD) warehouse and at least a second Surface Mount Device (SMD) warehouse are configured to form an integrated automated Surface Mount Device (SMD) warehouse cluster, wherein bin load units comprised in bins may be stored or retrieved by being redistributed between a first and a second automated Surface Mount Device (SMD) warehouse via a first opening in the automated Surface Mount Device (SMD) warehouse and a second opening in the second automated Surface Mount Device (SMD) warehouse, wherein a first actuator in the first automated Surface Mount Device (SMD) warehouse is configured to grip a bin load unit in the second opening and a second actuator in the second automated Surface Mount Device (SMD) warehouse is configured to grip a bin load unit in the first opening such that bin load units can be redistributed from said first Surface Mount Device (SMD) warehouse and said second Surface Mount Device (SMD) warehouse.

Figure 20:
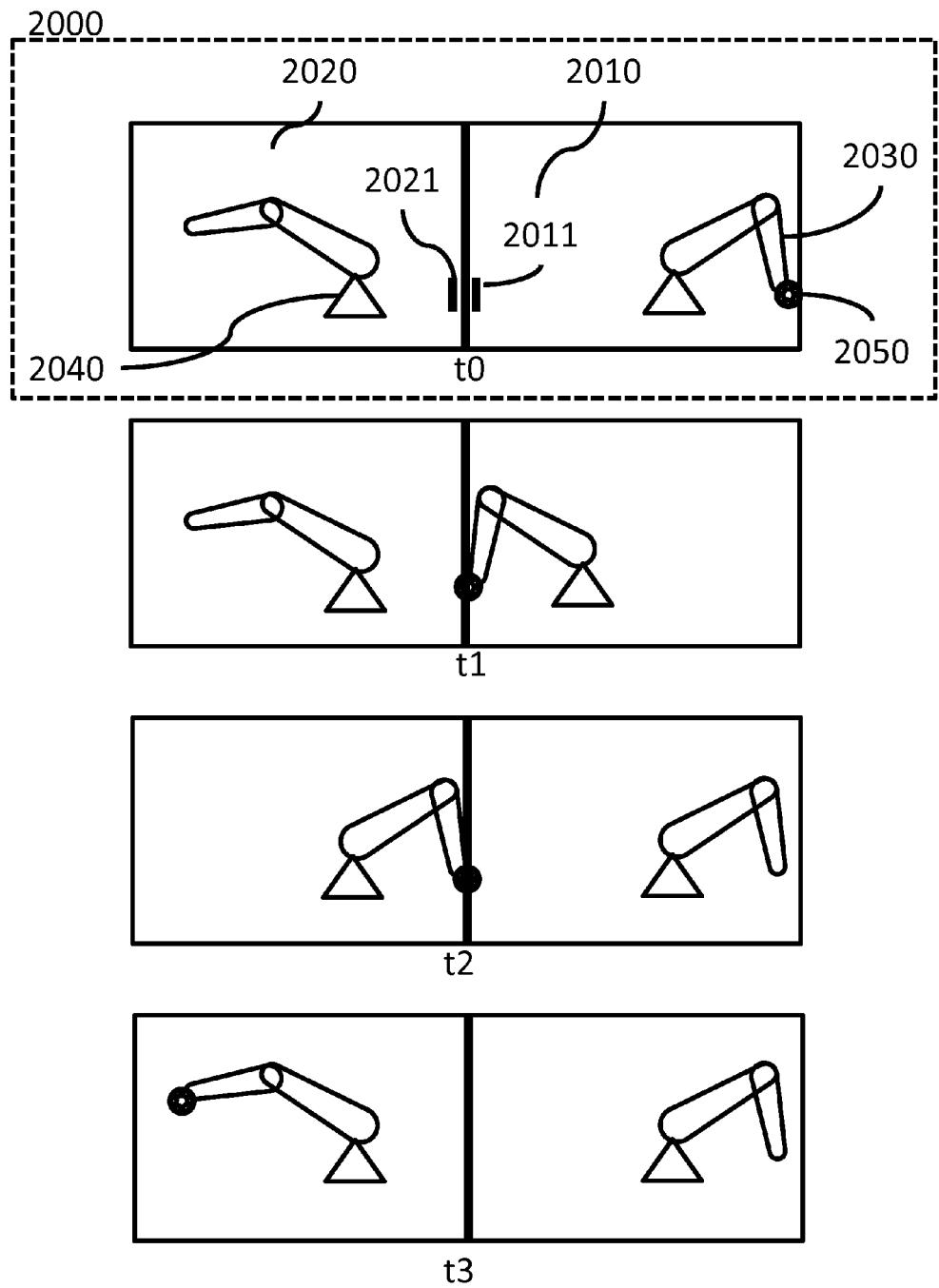
FIG. 20 illustrates an example of a time sequence on how bin load units may be retrieved and stored in a first and a second automated Surface Mount Device (SMD) warehouse in an integrated automated Surface Mount Device (SMD) warehouse cluster.

FIG. 20 illustrates an example of a time sequence on how bin load units may be retrieved or stored by being redistributed between a first and a second automated Surface Mount Device (SMD) warehouse in an integrated automated Surface Mount Device (SMD) warehouse cluster. A first Surface Mount Device (SMD) warehouse 2010 and a second Surface Mount Device (SMD) warehouse are configured to form an integrated automated Surface Mount Device (SMD) warehouse cluster 2000. The first Surface Mount Device (SMD) warehouse 2010 is configured with a first opening 2011 aligning with a second opening 2021 in the second Surface Mount Device (SMD) warehouse 2020, such that bin load units may be redistributed between the first 2010 and the second automated Surface Mount Device (SMD) warehouse 2020 via a first opening 2011 in the first automated Surface Mount Device (SMD) warehouse 2010 and a second opening 2021 in the second automated Surface Mount Device (SMD) warehouse 2020.

At time t0, a first actuator 2030 in the first automated Surface Mount Device (SMD) warehouse 2010 is configured to grip a bin load unit 2050 stored in the first automated Surface Mount Device (SMD) warehouse.

At time t1, the first actuator 2030 transports said bin or bin load unit 2050 to said first opening 2011. Further said first actuator 2030 releases the grip of the bin or bin load 2050 unit in a position where said bin or bin load unit protrudes into said second opening 2021 in said second Surface Mount Device (SMD) warehouse 2020. Alternatively, the first actuator 2030 in the first automated Surface Mount Device (SMD) warehouse 2010 is configured to release the grip of the a bin load unit 2050 in the first opening 2011.

At time t2, a second actuator 2040 in the second automated Surface Mount Device (SMD) warehouse 2020 is configured to grip the bin load unit 2050 protruding into said second opening 2021 in said second Surface Mount Device (SMD) warehouse 2020. Alternatively, the second actuator 2040 in the second automated Surface Mount Device (SMD) warehouse 2020 is configured to grip the bin load unit 2050 in the first opening 2011 such that bin load units can be redistributed from said first Surface Mount Device (SMD) warehouse and said second Surface Mount Device (SMD) warehouse.

At time t3, the second actuator 2040 in the second automated Surface Mount Device (SMD) warehouse 2020 is configured to release the grip and store the bin load unit 2050 in the second automated Surface Mount Device (SMD) warehouse 2020 or to presenting said retrieved bin by said actuator at a port of said automated Surface Mount Device (SMD.) warehouse In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

In yet another aspect of the technology disclosed, a computer program product comprising computer readable code is configured to, when executed in a processor, perform any or all of the method steps of the methods described herein.

In yet another aspect of the technology disclosed, a non-transitory computer readable memory on which is stored computer readable code is configured to, when executed in a processor, perform any or all of the method steps of the methods described herein.

Providing Information to an SMT System Operator

Providing Information Regarding an SMT Job

To operate the SMT system an operator responsible for monitoring the production of the SMT production units, to retrieve components from the SMD warehouse and to insert components in positions in the SMT pick and place machine. Today these tasks are performed by manual methods such as printouts. There is a need to provide the operator with dynamic information, e.g. into which position a retrieved component should be inserted in the SMT pick and place machine or which components that are about to run out when the SMT pick and place machine is in production of SMT production units. With improved information obtained by the operator, the risk of erroneous insertion in the SMT pick and place machine can be reduced and the time required to stop the production to replace a component tape reel can be reduced.

In one or more embodiments, a method for providing operator information in an Surface Mount Technology (SMT) system comprising an SMT information database, a SMT pick and place machine where SMT production have been started and an identity tag scanner, wherein SMT production at least comprises feeding components from a bin load unit to the SMY pick and place machine, the method comprising:

receiving a bin in said SMT pick and place machine, wherein said bin is adapted to comprise vertically oriented bin load units, wherein said bin load unit has an bin load unit identity tag attached to the bin load unit upwards facing surface scanning individual identity tags attached to pallets comprising component tape reels to obtain pallet ID's In one or more aspect of the technology disclosed describes a method for providing operator information in a Surface Mount Technology (SMT) system comprising an SMT information database, a SMT pick and place machine and an identity tag scanner, the method comprising:

receiving a bin in said SMT pick and place machine, wherein said bin is adapted to comprise vertically oriented bin load units, wherein said bin load unit has an bin load unit identity tag attached to the bin load unit upwards facing surface starting SMT production on said SMT pick and place machine;

scanning individual identity tags attached to bin load units comprising component tape reels to obtain bin load IDs In one or more aspects of the technology disclosed, said bin load units are comprised in pallets.

In one or more aspects of the technology disclosed describes a method for providing operator information in a Surface Mount Technology (SMT) system comprising an SMT information database, a SMT pick and place machine and an identity tag scanner, the method comprising:

receiving a bin in said SMT pick and place machine, wherein said bin is adapted to comprise vertically oriented pallets, wherein said pallet has an pallet identity tag attached to the pallets upwards facing surface starting SMT production on said SMT pick and place machine;

scanning individual identity tags attached to pallets comprising component tape reels to obtain pallet ID's In one example, the bin load units are comprised in pallets. Individual identity tags attached to pallets are scanned to obtain pallet IDs. The pallet ID is associated to other identities, such as component IDs, bin IDs, component tape reel IDs etc., in the SMT information database and the associated ID can be retrieved and presented to an operator on a display on the scanner or on the pick and place machine.

In yet another aspect of the technology disclosed, a method for providing operator information in an Surface Mount Technology (SMT) system comprising an SMT information database and a SMT pick and place machine where SMT production have been started, wherein started SMT production at least comprises feeding components from a bin load unit to the SMY pick and place machine, the method comprising:

receiving a bin in said SMT pick and place machine, wherein said bin comprises an alphanumerical display controller unit and a alphanumerical display receiving display data relating to an SMT job via a communications network;

present said display data on said alphanumerical display

In yet another aspect of the technology disclosed describes a method for providing operator information in a Surface Mount Technology (SMT) system comprising an SMT information database and a SMT pick and place machine, the method comprising:

receiving a bin in said SMT pick and place machine, wherein said bin has a bin identity tag attached to the bins forward facing surface such that the surface is facing an operator, wherein said identity tag comprises an alphanumerical display controller unit and a alphanumerical display starting SMT production on said SMT pick and place machine;

receiving display data relating to an SMT job from said SMT information database;

presenting said display data on said alphanumerical display.

In one example, the bin load units are comprised in a bin configured with a bin identity tag attached to the bins forward facing surface such that the surface is facing an operator, wherein said identity tag comprises an alphanumerical display controller unit and an alphanumerical display. Data relating to the number of components remaining in a bin load unit, such as a component tape reel, is continuously sent from the pick and place machine to the SMT information database. A selection of the identity of the pick and place machine, the location into where the bin should be placed in the pick and place machine, the type of component and the number of remaining component is received as display data and presented on the alphanumerical display.

In one or more aspects of the technology disclosed, said display data is received via a communications network.

In one or more aspects of the technology disclosed, said communications network is a wireless communications network.

In one or more aspects of the technology disclosed, said display data is relating to an SMT job retrieved from said SMT information database In one or more aspects of the technology disclosed, said bin has a bin identity tag in the form of a bar code attached to the bins forward facing surface such that the surface is facing an operator.

In one or more aspects of the technology disclosed, said communications network is an infrared network or a wireless local area network (WLAN).

In one or more aspects of the technology disclosed, the method further comprises sending said display information to an IR based system.

In one or more aspects of the technology disclosed, said display data is pushed down from a separate system.

In one or more aspects of the technology disclosed, the method step of receiving display data is preceded by scanning individual identity tags attached to bin load units, pallets bins, trolleys, magazines and/or pick and place machine.

In one example, the display data is received only after an individual identity tag has been scanned by an operator.

In yet another aspect of the technology disclosed describes a Surface Mount Technology (SMT) system for providing operator information comprising:

an SMT information database, a SMT pick and place machine; and;

an identity tag scanner, wherein said system is adapted to receiving a bin in said SMT pick and place machine, wherein said bin is adapted to comprise vertically oriented bin load units, wherein said bin load units has an bin load units identity tag attached to the bin load units upwards facing surface, In one or more aspects of the technology disclosed, said bin load units are comprised in pallets.

In yet another aspect of the technology disclosed describes a bin in a Surface Mount Technology (SMT) system for providing operator information in an Surface Mount Technology (SMT) system comprising an SMT information database and a SMT pick and place machine, wherein said bin is adapted to be received in a SMT pick and place machine operating in a started SMT production, the bin comprising:

an alphanumerical display controller unit and an alphanumerical display, wherein said controller is configured to:

receiving display data relating to an SMT job pushed down from a separate system via a communications network;

present said display data on said alphanumerical display

In yet another aspect of the technology disclosed, said display data comprises a selection of SMT job ID, predetermined component feeder position in the SMT pick and place machine, component type and remaining number of components on a component tape reel comprised in said bin In yet another aspect of the technology disclosed, a Surface Mount Technology (SMT) system for providing operator information is comprising:

an SMT information database, a SMT pick and place machine; and;

an identity tag scanner, wherein said system is adapted to receiving a bin in said SMT pick and place machine, wherein said bin is adapted to comprise vertically oriented pallets, wherein each of said pallets has an pallet identity tag attached to the pallet's upwards facing surface, In yet another aspect of the technology disclosed, a bin in a Surface Mount Technology (SMT) system is used for providing operator information, where the technology disclosed is enabling that said bin is adapted to be received in a SMT pick and place machine, and wherein said bin has a bin identity tag attached to the bins forward facing surface such that the surface is facing an operator, wherein said identity tag may also, or alternatively, comprise an alphanumerical display controller unit and a alphanumerical display.

Optimizing Presentation of Components in an SMD Warehouse

In order to reduce retrieval time in an automated Surface Mount Device (SMD) warehouse and speed up preparation of the SMT pick and place machine with components required to start production there is a need to optimize the configuration of stored units in the automated Surface Mount Device (SMD) warehouse. Idle time, e.g. when no storage or retrieval is performed by the automated Surface Mount Device (SMD) warehouse, may be used to pre-load bins with components required in an upcoming SMT job, to rearrange and optimize storage space within the automated Surface Mount Device (SMD) warehouse and to place stored units, such as bins or pallets, that are expected to be used within a foreseeable future, close to the port of the automated Surface Mount Device (SMD) warehouse. The bin load units are provided with identity tags that might be scanned individually and the identity of the tag together with the storage position of the bin is stored in memory coupled to the processor of the automated Surface Mount Device (SMD) warehouse.

In one or more aspect of the technology disclosed, a method is described for optimizing presentation of bin load units at a port in an automated Surface Mount Device (SMD) warehouse adapted to obtain information related to upcoming SMT jobs, the method comprising:

automatically redistributing stored bin load units based on predetermined rules to optimize presentation of bin load units at a port of said automated Surface Mount Device (SMD) warehouse based on information relating to upcoming SMT jobs.

In one or more aspects of the technology disclosed, said bin load units are stored in said automated Surface Mount Device (SMD) warehouse, and wherein redistributing is further based on SMT job related information received or retrieved from said SMT database.

In one example, a data structure indicating required components or bills-of-material for upcoming SMT jobs is received from the SMT information database. Bin load units corresponding to upcoming SMT jobs are loaded into bins and the bins are redistributed or moved based on predetermined rules to optimize presentation of bin load units at a port of said automated Surface Mount Device (SMD) warehouse.

In yet another aspect of the technology disclosed, said stored bin load units are comprised in individual stored pallets In one example a component tape reel and/or a SMT feeder is comprised in a pallet and the pallet is loaded into a bin.

In yet another aspect of the technology disclosed, said stored bin load units are comprised in one or more stored bins In one example a component tape reel and/or a SMT feeder is loaded into a bin.

In yet another aspect of the technology disclosed, said predetermined rules are based on information on component requirements of upcoming SMT jobs.

In yet another aspect of the technology disclosed, wherein at least one of said predetermined rules and said SMT job related information received or retrieved from said SMT database are based on, or provides, information on component requirements of upcoming SMT jobs.

In one example, information relating to upcoming SMT jobs SMT1, SMT2 and SMT3 is received, where the information comprises at least the required components or bills-of-material for upcoming SMT jobs SMT1, SMT2 and SMT3 and the sequential order they are planned to be executed or produced in the pick and place machine. The predetermined rule is dependent on the sequential order SMT1, SMT2 and SMT3, thus bin load units comprising required components in SMT1 would be loaded into bins an placed or located closest to the port of the automated Surface Mount Device (SMD) warehouse. Bin load units comprising required components in SMT2 would further be loaded into bins a placed or located second closest to the port of the automated Surface Mount Device (SMD) warehouse and so forth. Redistribution based on information on component requirements of upcoming SMT jobs is further described in relation to FIG. 14.

In yet another aspect of the technology disclosed, wherein at least one of said predetermined rules and said SMT job related information received or retrieved from said SMT database are based on, or provides, information on frequency of component use in previous SMT jobs.

In one example, the predetermined rule is dependent on frequency of use. Statistical information relating to component requirements of previously executed SMT jobs is retrieved from a memory in the automated Surface Mount Device (SMD) warehouse or from the SMT information database, example of statistical information indicating a high frequency of use is total number of components used or total number of components used per time unit. Bin load units comprising components with associated statistical information indicating the highest frequency of use would be loaded into bins an placed or located closest to the port of the automated Surface Mount Device (SMD) warehouse. Bin load units comprising components with associated statistical information indicating the second highest frequency of use would be loaded into bins a placed or located second closest to the port of the automated Surface Mount Device (SMD) warehouse and so forth.

In yet another aspect of the technology disclosed, wherein at least one of said predetermined rules and said SMT job related information received or retrieved from said SMT database are based on, or provides, user indication data from received user indications.

In one example, the predetermined rule is dependent on user indication data. User indication data is received that indicate an operator's preferred order of components. Bin load units comprising components indicated in the user indication data would be loaded into bins a placed or located closest to the port of the automated Surface Mount Device (SMD) warehouse in the order indicated in the user indication data.

In yet another aspect of the technology disclosed, said predetermined rules are based on information on frequency of component use in previous SMT jobs.

In yet another aspect of the technology disclosed, said predetermined rules are based on user indication data from received user indications.

The automated Surface Mount Device (SMD) warehouse may be configured in different manners to redistribute bin load units and bins within the automated Surface Mount Device (SMD) warehouse. In one embodiment, the automated Surface Mount Device (SMD) warehouse is configured with a first and a second actuator that cooperate when redistributing bin load units.

In yet another aspect of the technology disclosed, the method of automatically redistributing bin load units further comprises:

removing a first bin load unit comprised in a first stored bin by a first actuator comprised in said automated Surface Mount Device (SMD) warehouse;

move said first actuator to a position of a second stored bin within said automated Surface Mount Device (SMD) warehouse removing a second bin load unit comprised in a second stored bin by a second actuator comprised in said automated Surface Mount Device (SMD) warehouse;

insert said first bin load unit in said second stored bin by said first actuator Bin load units loaded in the same bin may be redistributed within the same bin, e.g. to optimize the utilization of a bin.

In yet another aspect of the technology disclosed, said first stored bin and said second stored bin are the same bin Sometimes the redistribution of bin load units might involve shifting a first bin load unit to a bin already loaded with a second bin load unit and further shifting said second bin load unit to a third bin.

In yet another aspect of the technology disclosed, the method further comprises:

moving said second actuator to a position of a third stored bin within said automated Surface Mount Device (SMD) warehouse inserting said second bin load unit in said third stored bin by said second actuator In one aspect of the technology disclosed, the automated Surface Mount Device (SMD) warehouse comprises a dedicated redistribution area, where bin load units can be redistributed between at least two bins.

In yet another aspect of the technology disclosed, the method of automatically redistributing bin load units further comprises:

retrieving a first stored bin to an redistribution area within said automated Surface Mount Device (SMD) warehouse retrieving a second stored bin to said redistribution area within said automated Surface Mount Device (SMD) warehouse In one embodiment of the invention, the automated Surface Mount Device (SMD) warehouse comprises a table attached to a first or second actuator, where bin load units can be redistributed between at least two bins. Typically, two bins would be placed on the table and bin load units would be redistributed from the first bin to the second bin and vice versa.

In yet another aspect of the technology disclosed, the method of automatically redistributing bin load units further comprises:

retrieving a first stored bin to a table attached to an actuator comprised in said automated Surface Mount Device (SMD) warehouse move said actuator to a position of a second stored bin within said automated Surface Mount Device (SMD) warehouse To allow flexible scaling of the automated Surface Mount Device (SMD) warehouse, several SMD warehouse units can be coupled together, so that bins can be passed from a first SMD warehouse to a second SMD warehouse and bin load units can be passed from a first SMD warehouse to a second SMD warehouse. Thus, redistribution of bin load units can be obtained between a plurality of automated Surface Mount Device (SMD) warehouses.

In yet another aspect of the technology disclosed, redistributing bin load units further comprises bins comprised in a plurality of automated Surface Mount Device (SMD) warehouses To further enhance the operation of actuators in the automated SMD warehouse, the bin can be configured with a predetermined gripping area for the actuator to grip. The bin can further be configured with guide rails for each compartment in the bin, wherein each compartment is adapted to receive a pallet.

In yet another aspect of the technology disclosed, said bin is adapted with a predetermined gripping area for the actuator to grip and guide rails, wherein said guide rails are adapted to receive a pallet.

To further enhance the operation of actuators in the automated SMD warehouse, the pallet can be configured with a predetermined gripping area for the actuator to grip. The pallet can further be configured with guide rails for each compartment in the bin, wherein each compartment is adapted to receive a pallet protrusion disposed on an outer surface of said pallet to engage said guide rail of said bin. The retaining precision of bin load units loaded in the bin, e.g. when feeding components into a pick and place machine, can be improved by the protrusions.

In yet another aspect of the technology disclosed, said bin load units further comprises a pallet adapted to comprise a component tape reel, wherein said pallet is adapted with a predetermined gripping area for the actuator to grip and a protrusion disposed on an outer surface of said pallet to engage said guide rail of said bin In yet another aspect of the technology disclosed, said bins are adapted to comprise bin load units, wherein said bin load unit comprises at least a component tape reel In yet another aspect of the technology disclosed, redistributing is performed during idle periods, wherein idle periods comprises periods when the automated Surface Mount Device (SMD) warehouse is not occupied with storing or retrieving bins.

In yet another aspect of the technology disclosed provides an automated Surface Mount Device (SMD) warehouse system for optimizing presentation of bin load units at a port comprising:

an actuator, such as a robot or robotic arm, adapted to retrieve or store bins, pallets or component tape reels at predetermined positions within the automated Surface Mount Device (SMD) warehouse based on control data received from a processor, a memory a processor, adapted to to obtain information related to upcoming SMT jobs, to store or retrieve bin load units at predetermined positions within said automated Surface Mount Device (SMD) warehouse by sending control data to said actuator, wherein said processor is adapted to further perform the steps of:

automatically redistributing stored bin load units by sending control data to said actuator based on predetermined rules to optimize presentation of bin load units at a port of said automated Surface Mount Device (SMD) warehouse based on information relating to upcoming SMT jobs In yet another aspect of the technology disclosed, an automated Surface Mount Device (SMD) warehouse for redistributing bin load units in an automated Surface Mount Device (SMD) warehouse, where said automated SMD warehouse is configured to obtain information related to upcoming SMT jobs from an SMT database, comprising:

a first actuator, such as a robot or robotic arm, configured to automatically redistributing stored bin load units in said automated Surface Mount Device (SMD) warehouse based on at least one of SMT job related information obtained from said SMT database and predetermined rules for optimizing presentation of bin load units at a port of said automated Surface Mount Device (SMD) warehouse, wherein said SMT job related information is received or retrieved by a processor and stored to a memory comprised in said Surface Mount Device (SMD) warehouse.

In yet another aspect of the technology disclosed, the automated Surface Mount Device (SMD) warehouse, further comprising a second actuator, such as a robot or robotic arm, configured to automatically redistributing stored bin load units in said automated Surface Mount Device (SMD) warehouse based on at least one of said SMT job related information and said predetermined rules.

In yet another aspect of the technology disclosed, the automated Surface Mount Device (SMD) warehouse, further comprising a redistribution area within said automated Surface Mount Device (SMD) warehouse.

In yet another aspect of the technology disclosed, the automated Surface Mount Device (SMD) warehouse, further comprising a table attached to said first actuator or a second actuator comprised in said automated Surface Mount Device (SMD) warehouse.

In yet another aspect of the technology disclosed, the automated Surface Mount Device (SMD) warehouse, wherein said first or second actuator is configured to receive control data based on at least one of said predetermined rules to optimize presentation of bin load units at a port of said automated Surface Mount Device (SMD) warehouse and said information obtained from an SMT database.

In yet another aspect of the technology disclosed, wherein said stored bin load units are comprised in individual stored pallets.

In yet another aspect of the technology disclosed, wherein said stored bin load units are comprised in one or more stored bins.

In yet another aspect of the technology disclosed an automated Surface Mount Device (SMD) warehouse system for optimizing presentation of bin load units at a port comprising:
an actuator, such as a robot or robotic arm, configured to retrieve or store bins, pallets or component tape reels at predetermined positions within the automated Surface Mount Device (SMD) warehouse based on control data received from a processor,
a memory
a processor, adapted to
to obtain information related to upcoming SMT jobs,
to store or retrieve bin load units at predetermined positions within said automated Surface Mount Device (SMD) warehouse by sending control data to said actuator,
wherein said processor is adapted to further control the steps of:
automatically redistributing stored bin load units by sending control data to said actuator based on at least one of predetermined rules to optimize presentation of bin load units at a port of said automated Surface Mount Device (SMD) warehouse and information received or retrieved from an SMT database.

In yet another aspect of the technology disclosed, said processor in said automated Surface Mount Device (SMD) warehouse adapted to further perform the method steps of described herein.

In yet another aspect of the technology disclosed, a computer program product is provided for optimizing presentation of bin load units at a port comprising computer readable code configured to, when executed in a processor, perform any or all of the method steps described herein.

In yet another aspect of the technology disclosed, a non-transitory computer readable memory is provided on which is stored computer readable code configured to optimizing presentation of bin load units at a port and to, when executed in a processor, perform any or all of the method steps described herein.

Identifying a Bin in an SMT System

When an operator is returning a bin to the automated Surface Mount Device (SMD) warehouse there is a need to determine the bin load units comprised in a bin by scanning a bin ID and retrieving the associated bin load units ID, such as pallet ID, component tape reel ID and SMT feeder ID, from an SMT information database.

When an operator is retrieving a bin from the automated Surface Mount Device (SMD) warehouse there is a need to associate a bin ID with the comprised bin load units IDs, such as pallet ID, component tape reel ID and SMT feeder ID, by scanning a bin ID and storing the associated bin load units IDs, such as pallet ID, component tape reel ID and SMT feeder ID, to an SMT information database.

In one or more aspect of the technology disclosed, a method in an automated Surface Mount Device (SMD) warehouse configured to store bins at predetermined positions within said automated Surface Mount Device (SMD) warehouse, the method comprising:
receiving a bin at a port of said automated Surface Mount Device (SMD) warehouse;
scanning an identity tag attached to said bin to obtain a bin ID.

In one or more aspect of the technology disclosed, the method further comprising:
storing said bin at a position within said automated Surface Mount Device (SMD) warehouse;

In one or more aspects of the technology disclosed, the method further comprising:
storing said position and said bin ID in a memory of said automated Surface Mount Device (SMD) warehouse.

In one or more aspects of the technology disclosed, describes a method in an automated Surface Mount Device (SMD) warehouse adapted to obtain information related to upcoming SMT jobs, to store bins at predetermined positions within said automated Surface Mount Device (SMD) warehouse, the method comprising:
receiving a bin at a port of said automated Surface Mount Device (SMD) warehouse;
scanning an identity tag attached to said bin to obtain a bin ID
storing said bin at a position within said automated Surface Mount Device (SMD) warehouse;
storing said position and said bin ID In yet another aspect of the technology disclosed, the method further comprising:
presenting said retrieved bin at a port of said automated Surface Mount Device (SMD) warehouse.

In yet another aspect of the technology disclosed, said bins are adapted to comprise bin load units, wherein each of said bin load unit comprises at least a component tape reel.

In yet another aspect of the technology disclosed, storing said position and said bin ID further comprises storing said position and said bin ID represented as parameters, such as a table, in a memory of said automated Surface Mount Device (SMD) warehouse.

In yet another aspect of the technology disclosed, storing said position and said bin ID further comprises storing said position and said bin ID represented as parameters in an SMT information database via a communications network.

In yet another aspect of the technology disclosed describes a method in an automated Surface Mount Device (SMD) warehouse adapted to obtain information related to upcoming SMT jobs, to retrieve bins at predetermined positions within said automated Surface Mount Device (SMD) warehouse, the method comprising:
retrieving said bin at a position within said automated Surface Mount Device (SMD) warehouse;
scanning an identity tag attached to said bin to obtain a bin ID;
presenting said retrieved bin at a port of said automated Surface Mount Device (SMD) warehouse;
storing said position and said bin ID.

In yet another aspect of the technology disclosed, wherein storing is performed to a memory of said automated Surface Mount Device (SMD) warehouse.

In yet another aspect of the technology disclosed, said bins are adapted to comprise bin load units, wherein said bin load unit comprises at least a component tape reel.

In yet another aspect of the technology disclosed, storing said position and said bin ID further comprises storing said position and said bin ID represented as parameters in a memory of said automated Surface Mount Device (SMD) warehouse.

In yet another aspect of the technology disclosed, storing said position and said bin ID further comprises storing said position and said bin ID represented as parameters in an SMT information database via a communications network.

In yet another aspect of the technology disclosed, a bin in a SMT system is adapted to be stored in an automated Surface Mount Device (SMD) warehouse system, said bin comprising:

an identity tag attached to said bin in a predetermined position thereby enabling an actuator comprised in said surface Mount Device (SMD) warehouse to scan said identity tag In yet another aspect of the technology disclosed, an automated Surface Mount Device (SMD) warehouse system comprising:

an actuator, such as a robot or robotic arm, adapted to retrieve or store bins, pallets or component tape reels at predetermined positions within the automated Surface Mount Device (SMD) warehouse based on control data received from a processor, a memory a processor, adapted to to obtain information related to upcoming SMT jobs, wherein said processor in said automated Surface Mount Device (SMD) warehouse adapted to perform the method steps described herein In yet another aspect of the technology disclosed, an automated Surface Mount Device (SMD) warehouse system comprising:

an actuator, such as a robot or robotic arm, adapted to retrieve or store bins, pallets or component tape reels at predetermined positions within the automated Surface Mount Device (SMD) warehouse based on control data received from a processor, a memory a processor, adapted to to obtain information related to upcoming SMT jobs, wherein said processor in said automated Surface Mount Device (SMD) warehouse adapted to perform the method steps described herein.

Pallets in an SMT System

When handling of pallets in an SMT system there is a need to ensure that a component tape reel comprised in a pallet does not fall out at the same time as an identity tag attached to the component tape reel may be scanned by an operator or actuator in automated Surface Mount Device (SMD) warehouse. In order for the processor in the automated Surface Mount Device (SMD) warehouse to maintain knowledge of the contents of stored bins the identities of component tape reels comprised in the bins are determined.

In one or more aspect of the technology discloses a method in a Surface Mount Technology (SMT) system for a pallet, wherein said pallet is configured with an attached identity tag in a predetermined position, wherein said pallet is adapted to comprise a component tape reel, the method comprising:

gripping said bin load unit comprised in a bin; and;

scanning said identity tag;

In yet another aspect of the technology disclosed, wherein gripping and scanning is performed by an actuator comprised in an automated Surface Mount Device (SMD) warehouse.

In yet another aspect of the technology disclosed, wherein gripping and scanning is performed by an operator of the SMT system.

A problem when handling component tape reels in an automated Surface Mount Device (SMD) warehouse and in a pick and place machine is that the component tape reels vary in size and therefore requires different receptacle arrangements for different reel sizes. This may be solved by using a pallet configured to handle varying component tape reel sizes. Yet another problem is that the identity label of a component tape reel comprised in a pallet may be difficult or even impossible to scan. Yet another problem identified by the inventors is to retain or comprise a component tape reel in a pallet, while the reel can freely rotate.

In yet another aspect of the technology disclosed, a pallet for use in a Surface Mount Technology (SMT) system, said pallet is comprising a backplane structure adapted to provide support to a component tape reel, said pallet is further adapted to hold or carry a component tape reel by providing a component tape reel retainer structure for keeping or retaining the component tape reel attached to, or contained in, the pallet, said pallet is further configured to provide an opening for enabling the scanning of a barcode on a component tape reel that is attached to, or contained in, the pallet. The provisions of the technology disclosed of a pallet with a component tape reel retainer structure for keeping or retaining the component tape reel attached to, or contained in, the pallet and an opening for enabling the scanning of a barcode on a component tape reel that is attached to, or contained in, the pallet may be in particular important when an actuator, such as a robot, comprised in an automated SMD warehouse is retrieving the pallet from a bin or trolley, by gripping and lifting the pallet with the reel from the bin, e.g. when the robot is automatically scanning a barcode of a component tape reel comprised in a pallet to determine the identify said component tape, i.e. the tape reel-ID.

A component tape reel is used together with an SMT component feeder or tape guide, when used in operation or production of an SMT pick and place machine. In the present invention, the component tape on a component tape reel is typically threaded in an SMT feeder/tape guide and the component tape reel identity is associated to the SMT component feeder/tape guide identity in the SMT information database. Handling of components in an SMT system can therefore be improved by storing the component tape reel together with the SMT component feeder/tape guide in the automated Surface Mount Device (SMD) warehouse, in particular handling of both in pallets in an SMT system.

In yet another aspect of the technology disclosed, said pallet is further adapted to comprise an SMT feeder for guiding the component tape of a component tape reel attached to, or contained in said pallet to the picking position of a SMT pick-and-place machine.

As an identity tag attached to the component tape reel can be scanned, a retaining arrangement is required.

In yet another aspect of the technology disclosed, said component tape reel structure is further configured to provide retaining support in a Z axis (normal) direction on at least one of a peripheral or close to the center of a component tape reel, and wherein said opening is an opening in said component tape reel retainer structure that is adapted to allow the scanning of an identity tag (arbitrarily placed) barcode on the side of a component tape reel attached to, or contained in, the pallet without blocking the scanning light beam of an pallet-external barcode scanner.

In yet another aspect of the technology disclosed, said component tape reel retainer structure is configured to provide support to a component tape reel contained in the pallet in a Z axis direction opposite the backplane, thereby enabling the pallet to retain a component tape reel attached to, or contained in, the pallet without pallet-external support to the reel when the pallet is positioned in a vertical upright position or upside down with the backside of the backplane facing up.

In yet another aspect of the technology disclosed, said component tape reel retainer structure is providing a structure configured to allow a component tape reel to (freely) rotate while being attached to, or contained in, said pallet.

When handling the component tape reel, a common problem is to avoid that the component tape unwinds from the component tape reel, which leads to unwanted delays in the production of SMT production units in the SMT pick and place machine.

In yet another aspect of the technology disclosed, said component tape reel retainer structure is further providing a structure for retaining a component tape reel in a radial direction and within an essentially fixed volume within said pallet when the component tape reel is rotating while being contained in said pallet.

In yet another aspect of the technology disclosed, said component tape reel retainer structure is comprising at least one of a nave and a reel-peripheral support structure oriented to provide support to a component tape reel at the, or close to, the periphery of a component taper reel attached to, or contained in, said pallet, and wherein said at least one of a nave and a reel-peripheral support structure is configured to provide retaining support for holding a component taper reel while not blocking the scanning of a barcode on the component tape reel attached to, or contained in, said pallet.

In yet another aspect of the technology disclosed, said at least one of nave and reel-peripheral support structure is adapted to retain a component tape reel in at least one of a Z axis (normal) or radial direction.

In yet another aspect of the technology disclosed, wherein the pallet is adapted to prevent radial movement of a component taper reel attached to, or contained in, the pallet by providing holding support for keeping the center point of the component tape reel that is rotating within said pallet at a fixed, or essentially fixed, position also when the component tape reel is rotating within said pallet.

In yet another aspect of the technology disclosed, the pallet is providing component tape reel structure comprising an X axis component tape reel retainer, a Y axis component tape reel retainer and a Z axis component tape reel retainer, wherein said X, Y, Z axis retainers are adapted to allow said component tape reel to rotate within said pallet.

In one or more aspects of the technology disclosed, a Surface Mount Technology (SMT) system for a pallet, wherein said pallet is configured with an attached identity tag in a predetermined position, wherein said pallet is adapted to comprise a component tape reel, the system adapted to perform the method steps described herein.

In yet another aspect of the technology disclosed, a computer program product comprising computer readable code is configured to, when executed in a processor, perform any or all of the method steps described herein.

In yet another aspect of the technology disclosed, a non-transitory computer readable memory on which is stored computer readable code is configured to, when executed in a processor, perform any or all of the method steps described herein.

Identifying Pallets in an SMT System

There is a need to be able to scan identity tags of pallets comprised in a bin in an automated Surface Mount Device (SMD) warehouse as well as when inserted in an SMT pick and place machine. This enables automatic scanning of a plurality of pallets comprised in a bin when returning the bin to an automated Surface Mount Device (SMD) warehouse. This also enables manual operator scanning of a plurality of pallets comprised in a bin inserted in an SMT pick-and-place machine.

In one or more aspect of the technology disclosed a method in a Surface Mount Technology (SMT) system for scanning of a plurality of pallets comprising an identity tag scanner and an SMT information database, wherein said pallet is comprised in and vertically oriented in a bin, wherein said pallet has an pallet identity tag attached to the pallets upwards facing surface, the system configured to perform the steps of:

scanning individual identity tags attached to pallets comprised in said bin to obtain pallet IDs In yet another aspect of the technology disclosed, wherein a pallet of said pallets comprising at least a component tape reel.

In yet another aspect of the technology disclosed, said scanning is performed by an actuator comprised in an automated Surface Mount Device (SMD) warehouse.

In yet another aspect of the technology disclosed, a method in a Surface Mount Technology (SMT) system for scanning of a plurality of pallets comprising an identity tag scanner and an SMT information database, wherein said pallet is comprised in and vertically oriented in a bin, wherein said pallet has an pallet identity tag attached to the pallets upwards facing surface, the system is configured to perform the step of:

scanning individual identity tags attached to pallets comprised in said bin to obtain pallet IDs.

In yet another aspect of the technology disclosed, said pallet comprising at least a component tape reel;

In yet another aspect of the technology disclosed, said scanning is performed by an operator of the SMT system.

In yet another aspect of the technology disclosed, a pallet for use in a Surface Mount Technology (SMT) system, said pallet is comprising a backplane structure adapted to provide support to a component tape reel attached to, or contained in, said pallet, wherein said pallet is further adapted to hold or carry a component tape reel by providing a component tape reel retainer structure for keeping or retaining the component tape reel attached to, or contained in, the pallet, wherein said pallet is configured with an attached identity tag (in form of a barcode) which is adapted to associate said pallet with an identity, wherein said pallet is adapted to comprise a component tape reel. This is in particular important when an actuator, such as a robot, comprised in an automated SMD warehouse is retrieving the pallet from a bin by gripping and lifting the pallet with the reel from the bin, e.g. when the robot is automatically scanning a barcode of a pallet or a barcode of a component tape reel comprised in a pallet to determine the identify said pallet-ID or tape reel-ID.

In yet another aspect of the technology disclosed, said pallet identity tag is attached to the pallets upwards facing surface when the said pallet is comprised in and vertically oriented in a bin.

In yet another aspect of the technology disclosed, said Pallet-ID is a tag in a predetermined (well-defined) position known to a barcode scanner/reading unit.

In yet another aspect of the technology disclosed, said Pallet-ID is a tag configured to be scanned from above, known to a barcode scanner and/or robot in a SMT Warehouse In yet another aspect of the technology disclosed, said Pallet-ID is a tag that may be easily scanned by an operator when placed in a pick-and-place machine In yet another aspect of the technology disclosed, said pallet is further configured to provide an opening for enabling the scanning of a barcode on a component tape reel that is attached to, or contained in, the pallet.

In yet another aspect of the technology disclosed, said pallet is further adapted to comprise an SMT component feeder for guiding the component tape of a component tape reel attached to, or contained in said pallet to the picking position of a SMT pick-and-place machine.

In yet another aspect of the technology disclosed, a computer program product comprising computer readable code configured to, when executed in a processor, perform any or all of the method steps described herein.

In yet another aspect of the technology disclosed, a non-transitory computer readable memory on which is stored computer readable code configured to, when executed in a processor, perform any or all of the method steps described herein.

In yet another aspect of the technology disclosed, a computer program product comprising computer readable code configured to, when executed in a processor, perform any or all of the method steps described herein.

In yet another aspect of the technology disclosed, a non-transitory computer readable memory on which is stored computer readable code configured to, when executed in a processor, perform any or all of the method steps described herein.

Preventing Unwinding of a Component Tape Reel

When a pallet is removed from an SMT pick and place machine the component tape might unwind resulting in complicated handling and manual re-winding of the component tape. It is therefore a need to prevent unwinding of a component tape reel, in particular when an actuator, such as a robot, comprised in an automated SMD warehouse is retrieving the pallet from a bin by gripping and lifting the pallet with the reel from the bin, e.g. when the robot is automatically scanning a barcode of a pallet or a barcode of a component tape reel comprised in a pallet to determine the identify said pallet-ID or tape reel-ID.

In one or more embodiments, a method in a Surface Mount Technology (SMT) system for starting SMT production, wherein said SMT system comprises a pallet and an SMT pick and place machine, wherein said pallet is further adapted to hold or carry a component tape reel by providing a component tape reel retainer structure for keeping or retaining the component tape reel attached to, or contained in, the pallet, wherein said pallet is comprised in and vertically oriented in a bin.

In one or more aspect of the technology disclosed, a method in a Surface Mount Technology (SMT) system for preventing unwinding of a component tape comprised on a component tape reel, wherein said SMT system comprises a pallet and an SMT pick and place machine, wherein said pallet is further adapted to hold or carry a component tape reel by providing a component tape reel retainer structure for keeping or retaining the component tape reel attached to, or contained in, the pallet the method comprising:

engaging a friction break upon removal of said pallet from said SMT pick and place machine, hereby preventing unwinding of the tape, e.g. when the reel is no longer feeding components to a pick-and-place machine.

In yet another aspect of the technology disclosed, a pallet for use in a Surface Mount Technology (SMT) system, said pallet is comprising a backplane structure adapted to provide support to a component tape reel attached to, or contained in, said pallet, wherein said pallet is further adapted to hold or carry a component tape reel by providing a component tape reel retainer structure for keeping or retaining the component tape reel attached to, or contained in, the pallet, said component tape reel retainer structure is comprising at least one of a nave and a reel-peripheral support structure, said reel-peripheral support structure is adapted to provide support to a component tape reel at the, or close to, the periphery of a component taper reel attached to, or contained in, said pallet.

In one or more embodiments, wherein the pallet 1810 further comprising a backplane 1811 and a component tape reel retainer structure in the shape of a box, wherein said box is configured with a bottom 18121, and four side walls 18122 and a slit 1840 configured to allow a component tape on a comprised component tape reel 1820 protrude through the slit.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said Z axis component tape reel retainer is adapted with a friction brake, thereby preventing unwinding of the tape, e.g. when the reel is no longer feeding components to a pick-and-place machine.

In yet another aspect of the technology disclosed, wherein said an X-axis component tape reel retainer or a Y-axis component tape reel retainer is adapted with a spring and a seat located in the opposite side of said component tape reel, wherein said spring is biasing said component tape reel against said seat.

In yet another aspect of the technology disclosed, the pallet is further configured to provide an opening for enabling the scanning of a barcode on a component tape reel that is attached to, or contained in, the pallet.

General

Figure 4:
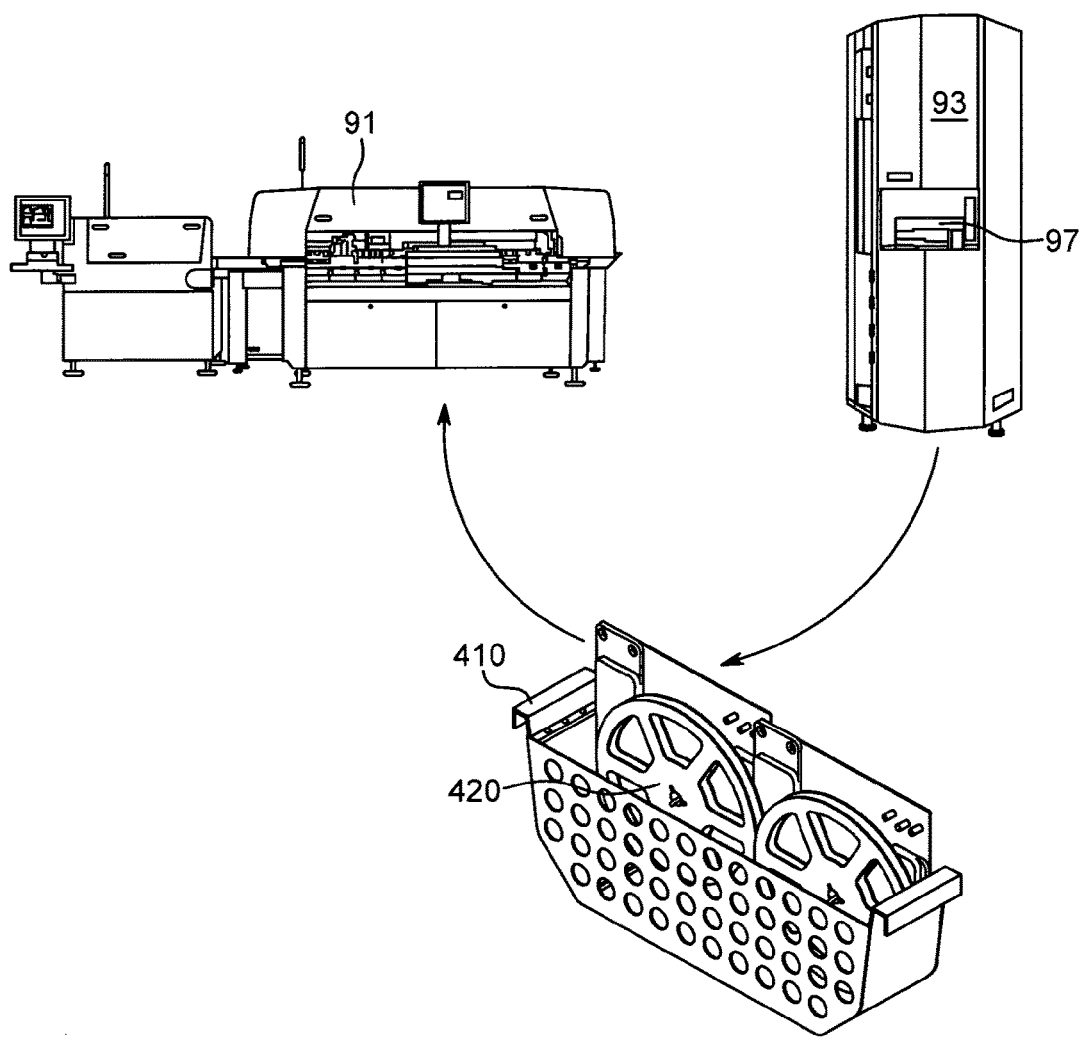
FIG. 4 shows an example of the technology disclosed where bins which are pre-loaded based on upcoming SMT jobs are retrieved at an automated surface mount device (SMD) warehouse and inserted into a component feeding position of the SMT pick and place machine.

FIG. 4 shows an aspect of the technology disclosed of a method in a Surface Mount Technology (SMT) system comprising an automated Surface Mount Device (SMD) warehouse 93, an SMT information database and a SMT pick and place machine 91, the method comprising:

receiving input data;

retrieving a bin based on said input data and a parameter representing a position within said automated Surface Mount Device (SMD) warehouse, wherein said bin 410 is adapted to comprise bin load units 420, wherein said bin load unit comprises at least a component tape reel.

presenting said retrieved bin at a port 97 of said automated Surface Mount Device (SMD) warehouse;

load said bin 410 in said SMT pick and place machine 91

Figure 5:
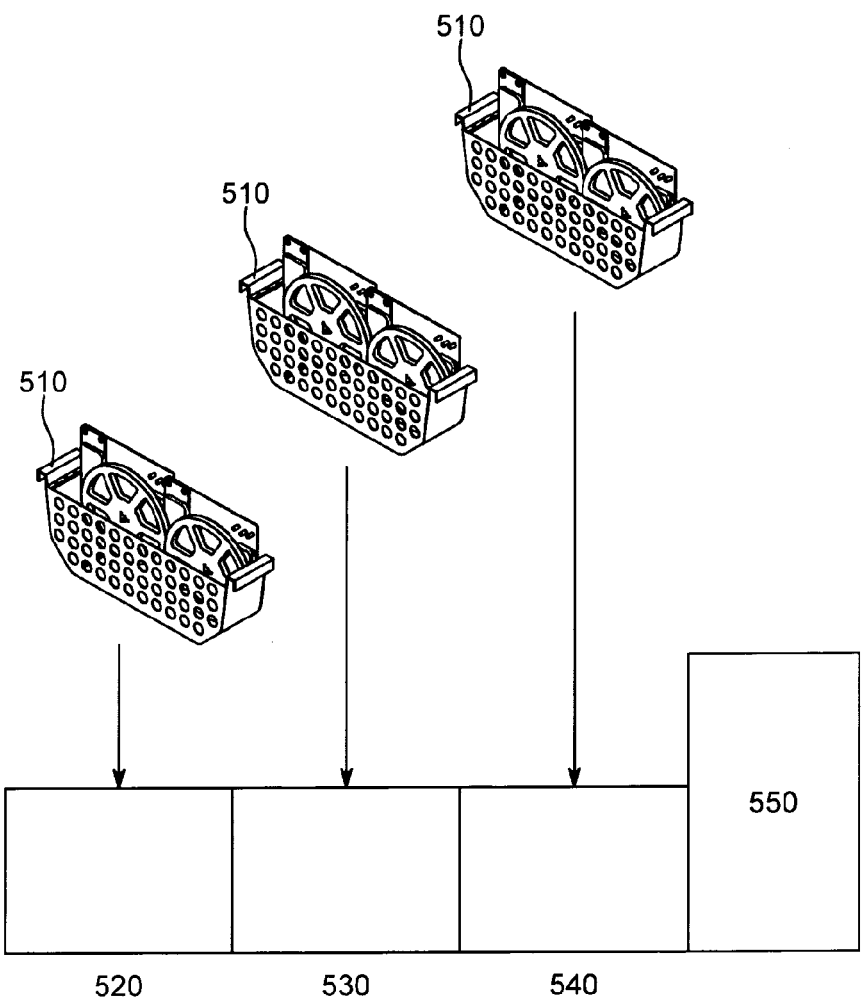
FIG. 5 shows an example where bins that are pre-loaded based on upcoming SMT jobs are inserted into a component feeding position of the SMT pick and place machine.

FIG. 5 shows a schematic view of pre-loaded bins 510, e.g. pre-loaded based on component requirements of an upcoming SMT job, being inserted or loaded into component feeding positions 520, 530 and 540 of the pick and place machine 550.

In some embodiments, the bins might comprise pallets that in turn comprise component tape reels and optionally a matching SMT feeder.

In some aspect of the technology disclosed the bin might be adapted with an alphanumerical display controller that is adapted to receive display data by wired or wireless communication, wherein the data might be relating to an upcoming SMT job and displayed to the operator, e.g. the position at the pick and place machine where the bin should be inserted, time or date, the number of remaining components remaining in the bin, an alert to replace the bin or manually refill the bin with bin load units or other alarm conditions relating to production of SMT production units.

The information, e.g. component requirements, used to pre-load bins and presenting bins at a port of the automated Surface Mount Device (SMD) warehouse might be entered by the operator via a input/output device comprised in the automated Surface Mount Device (SMD) warehouse or obtained from the SMT information database, either actively retrieved by request/reply or pushed from the SMT information database or other node connected to the communication network.

When the automated Surface Mount Device (SMD) warehouse receives a bin the processor comprised in the automated Surface Mount Device (SMD) warehouse stores the position where the bin is stored to a memory, e.g. comprised in the automated Surface Mount Device (SMD) warehouse.

The automated Surface Mount Device (SMD) warehouse comprises one or several actuators, such as a robot, robot arm or other actuator, as would be understood by a person skilled in the art, that are able to redistribute bins or bin load units within the automated Surface Mount Device (SMD) warehouse or between connected automated Surface Mount Device (SMD) warehouses.

In some aspect of the technology, disclosed bins might be brought to a designated intermediate redistribution area where bin load units might be redistributed within or between two or more bins.

In some aspect of the technology disclosed more than one actuator might be comprised in the automated Surface Mount Device (SMD) warehouse, thereby enabling insertion in fully loaded bins, e.g. by first removing a first bin load unit with a first actuator and fill the empty position in the same bin with another bin unit by a second actuator, much similar how a human being would redistribute bin load units between bins. Obviously, the process might involve one two or several bins until the redistribution is complete.

One important feature of certain aspects of the technology disclosed is that pre-loaded bins are provided at the port or opening of the automated Surface Mount Device (SMD) warehouse based on, or according to, information relating to an upcoming SMT job.

One particularly important feature of certain aspects of the technology disclosed is that the pre-loaded bins are automatically provided (e.g. retrieved and presented) to an operator at the port by an actuator, such as a robot, comprised in the automated Surface Mount Device (SMD) warehouse, based on, or according to, information relating to an upcoming SMT job which is received, or has been received, by the automated Surface Mount Device (SMD) warehouse, without any loading of bin load units (e.g. reels or component feeders/tape guides) in bins or scanning of barcodes by the operator.

Figure 8A:
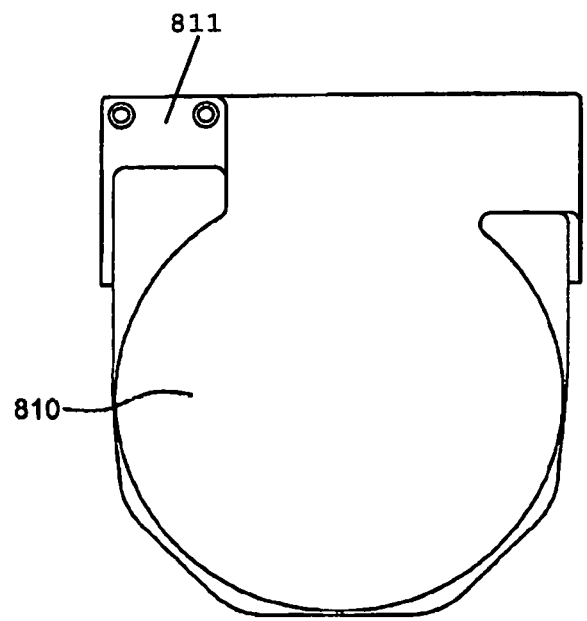
FIG. 8a shows an example of a pallet.

FIG. 8a shows an example of a pallet 810. The pallet 810 is configured with a predetermined gripping area 811 for the actuator to grip.

Figure 8B:
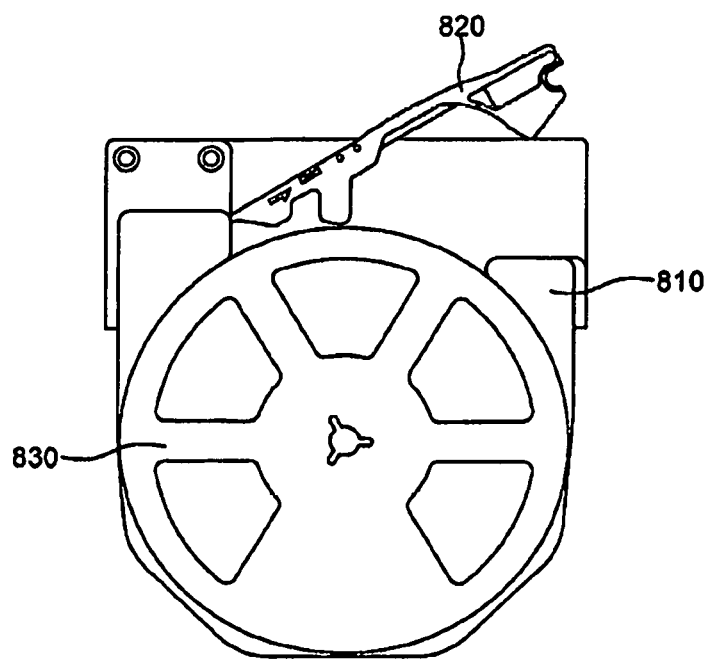
FIG. 8b shows an example of a pallet comprising a component tape reel and an SMT component feeder/tape guide.

FIG. 8b shows an example of a pallet 810 comprising a component tape reel 830 and an SMT feeder 820.

Figure 9:
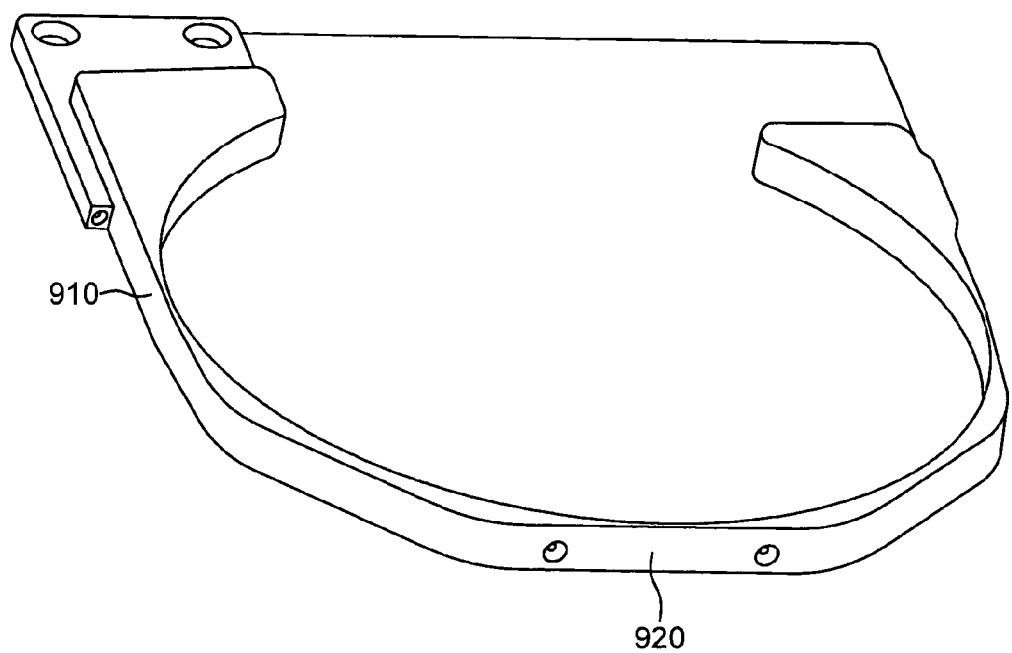
FIG. 9 shows an example of a pallet adapted with an X axis component tape reel retainer and a Y axis component tape reel retainer, wherein said X, Y, Z axis retainers are adapted to allow said component tape reel rotate.

FIG. 9 shows an example of a pallet, wherein said pallet is adapted to comprise a backplane and, an X axis component tape reel retainer and a Y axis component tape reel retainer wherein said X, Y axis retainers are adapted to allow said component tape reel to rotate. The retainers restricts movement of a comprised component tape reel along the X axis and Y axis.

Figure 10A:
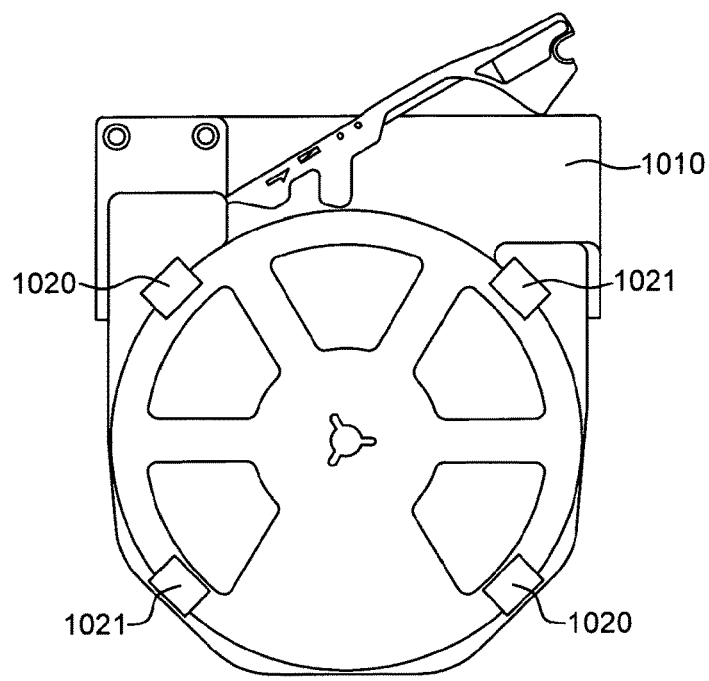
FIG. 10a shows an example of a pallet adapted with a Z-axis component tape reel retainer, wherein the Z-axis component tape reel retainer comprises a backplane and a peripheral Z-axis component tape reel retainer.

FIG. 10a shows an example of a pallet, wherein said pallet is adapted to comprise a backplane 1010, a combined reel-peripheral support structure in the form of an X axis component tape reel retainer 1020, a Y axis component tape reel retainer 1020 and a Z axis component tape reel retainer 1020, wherein said X, Y, Z axis retainers are adapted to allow said component tape reel rotate. The retainers restrict movement of a comprised component tape reel along the X-axis, Y-axis and Z-axis.

Figure 10B:
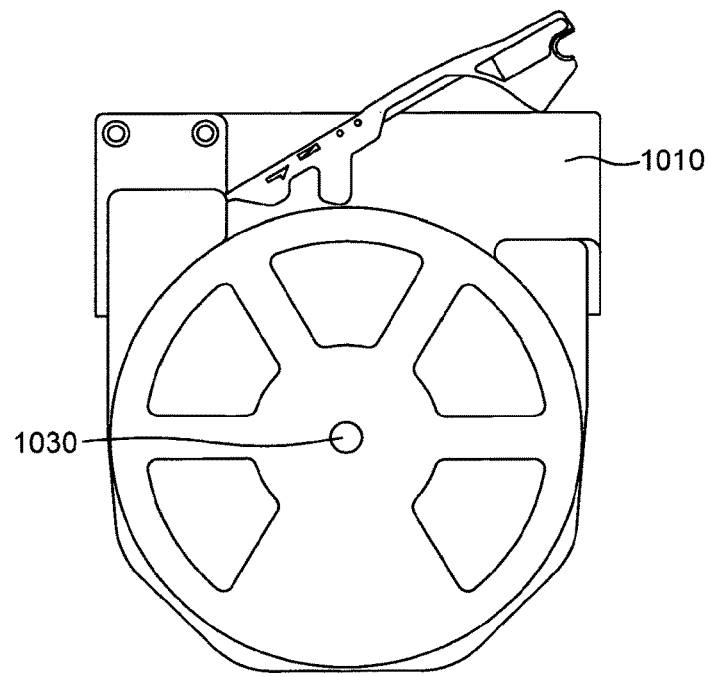
FIG. 10b shows an example of a pallet adapted with a Z-axis component tape reel retainer, wherein the Z-axis component tape reel retainer comprises a backplane and a central Z-axis component tape reel retainer.

FIG. 10b shows yet an example embodiment of the invention, wherein said Z-axis component tape reel retainer comprises a backplane and a nave or central Z-axis component tape reel retainer 1030. In yet another aspect of the technology disclosed said Z-axis component tape reel retainer comprises a backplane and a central Z-axis component tape reel retainer.

Figure 12A:
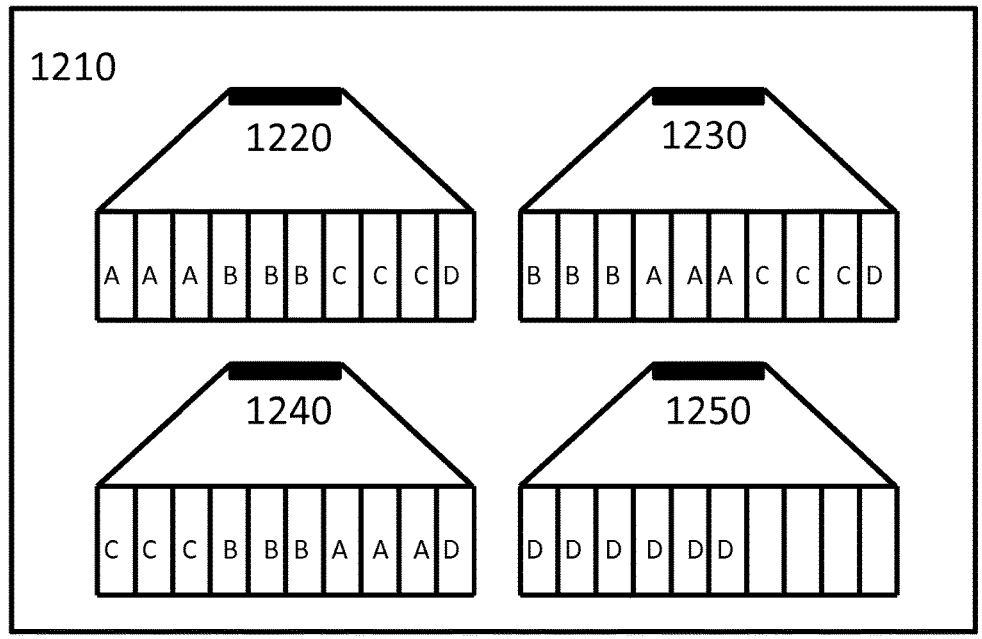
FIG. 12a and FIG. 12b shows schematically how bin loading units are redistributed between two or more stored bins in the automated Surface Mount Device (SMD) warehouse, e.g. based on component requirements of upcoming SMT jobs.
Figure 12B:
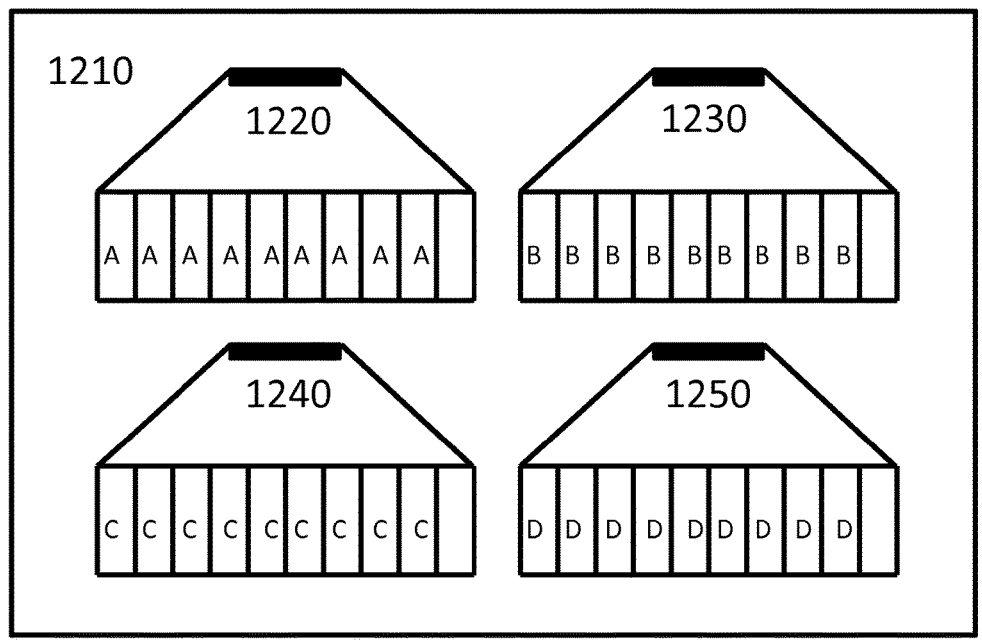

FIGS. 12a and 12b shows schematically how in an embodiment bin loading units, denoted by letters A-D in the figure, are redistributed between two or more stored bins in the automated Surface Mount Device (SMD) warehouse, e.g. based on component requirements of upcoming SMT jobs. In one example FIG. 12b illustrates how bins 1220-1250 are pre-loaded based on the component requirements of upcoming SMT jobs, e.g. job A, job B, job C and job D.

Figure 13:
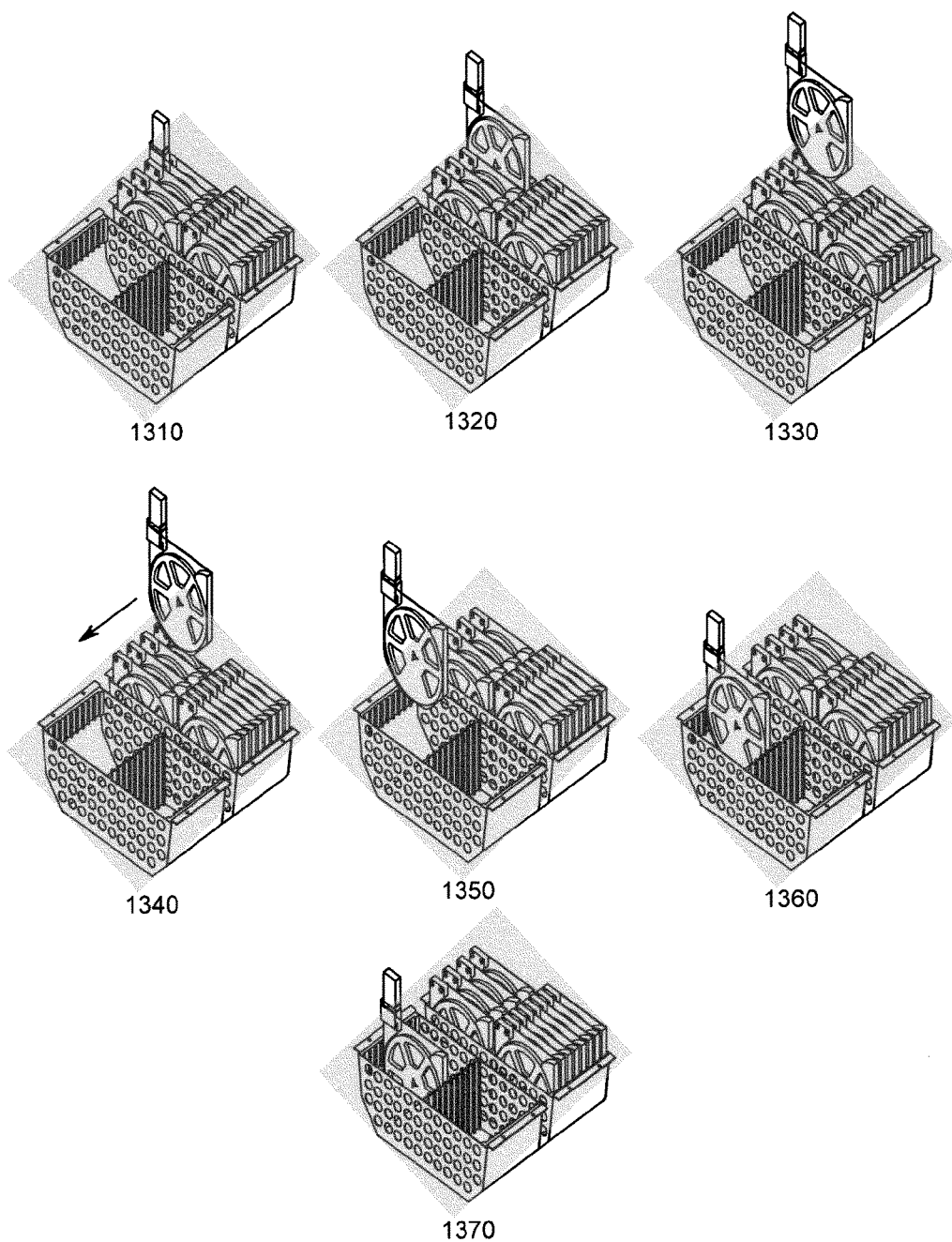
FIG. 13 shows schematically how bin loading units may be redistributed between two or more stored bins in the automated Surface Mount Device (SMD) warehouse, e.g. by being brought to a designated intermediate redistribution area where bin load units might be redistributed.

FIG. 13 shows schematically how bin loading units may be redistributed between two or more stored bins in the automated Surface Mount Device (SMD) warehouse, e.g. by being brought to a designated intermediate redistribution area where bin load units might be redistributed. The actuator or robotic arm of the automated Surface Mount Device (SMD) warehouse grips a load unit in a first bin and moves to a compartment in a second bin, illustrated by the image sequence 1310-1370.

Figure 14A:
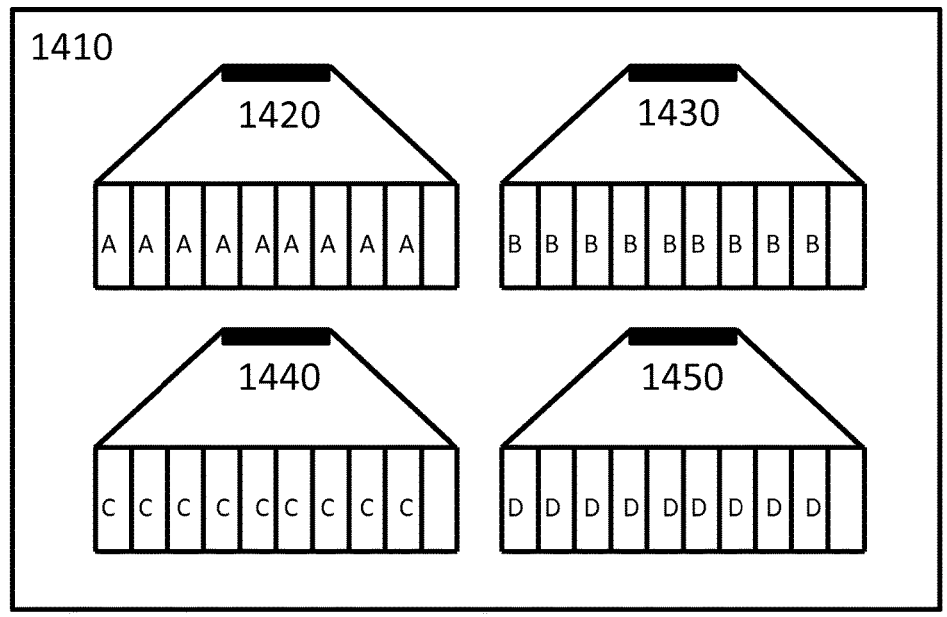
FIGS. 14a and 14b shows schematically how bins are redistributed between positions in the automated Surface Mount Device (SMD) warehouse, e.g. based on component requirements of upcoming SMT jobs.
Figure 14B:
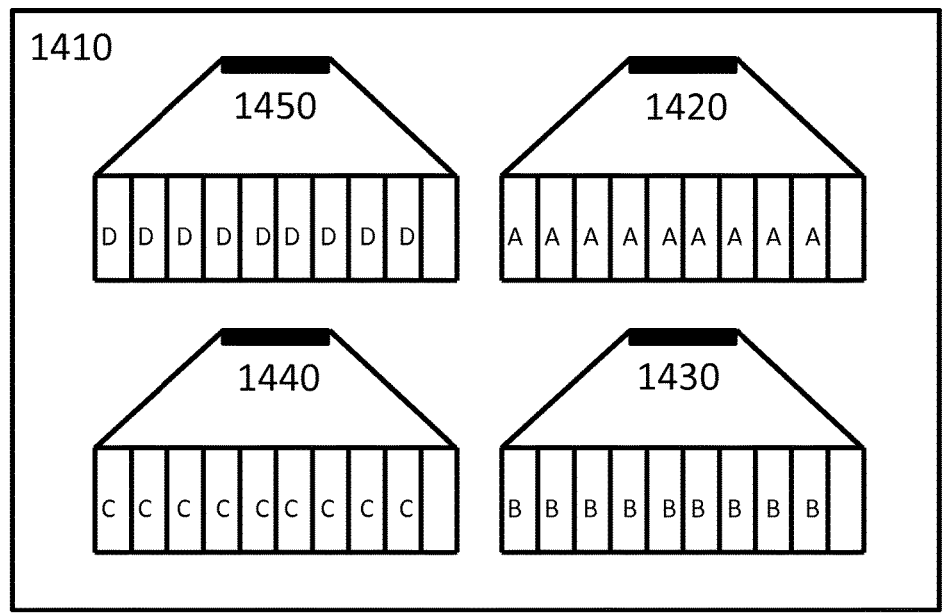

FIGS. 14a and 14b shows schematically how bins may be redistributed between positions in the automated Surface Mount Device (SMD) warehouse based on component requirements of upcoming SMT jobs. In one example, a SMT job list or sequence of job D, job a, job C and job D are to be performed and by redistributing the bins the retrieval time for the bin pre-loaded for SMT job D can be reduced as the distance to the port is reduced.

Figure 16:
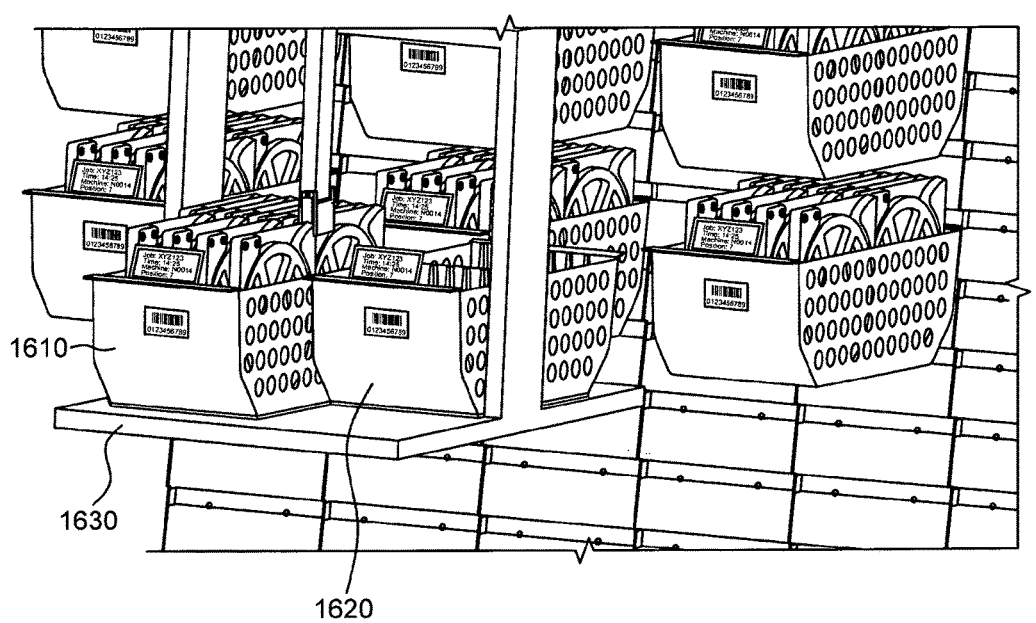
FIG. 16 shows schematically how bin load units are automatically redistributed between positions in the automated Surface Mount Device (SMD) warehouse using a table.

FIG. 16 shows schematically how bin load units is automatically redistributed between positions in the automated Surface Mount Device (SMD) warehouse using a table 1630. A first stored bin 1610 is retrieved to a table attached to an actuator comprised in said automated Surface Mount Device (SMD) warehouse and said actuator is moved to a position of a second stored bin 1620 within said automated Surface Mount Device (SMD) warehouse. In yet an embodiment the second bin 1620 is retrieved to the table 1630. In yet another embodiment, bin load units is automatically redistributed between positions in the automated Surface Mount Device (SMD) warehouse using a table by redistributing bin load units from said first bin 1610 to said second bin 1620.

Figure 17A:
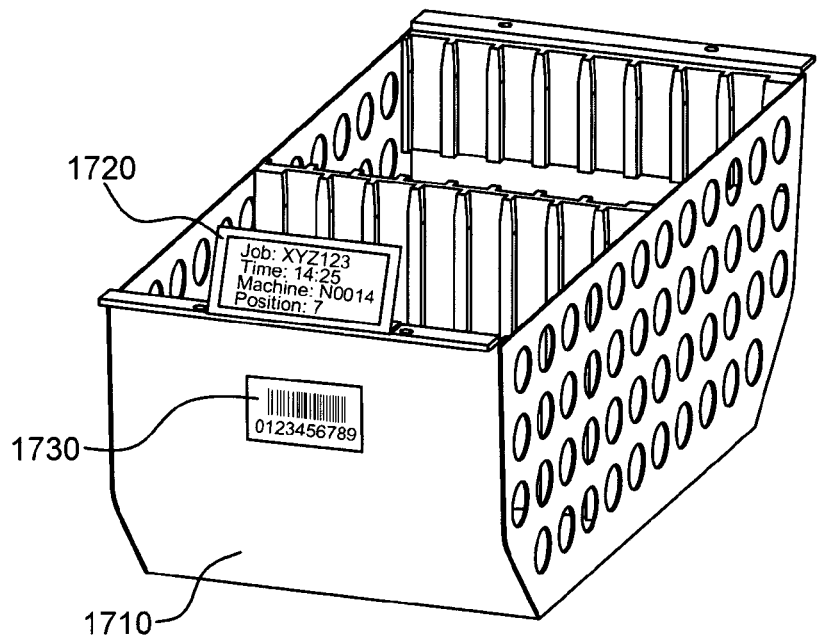
FIG. 17a shows an embodiment of the invention, wherein a bin 1710 is configured with an alphanumerical display 120 with an integrated alphanumerical display controller and an identity tag attached 1730 to said bin such that a bin ID can be obtained.

FIG. 17a shows an embodiment of the invention, wherein a bin 1710. is configured with an alphanumerical display 120 with an integrated alphanumerical display controller and an identity tag attached 1730 to said bin such that a bin ID can be obtained. IN one example, this identity tag is a bar code.

Figure 17B:
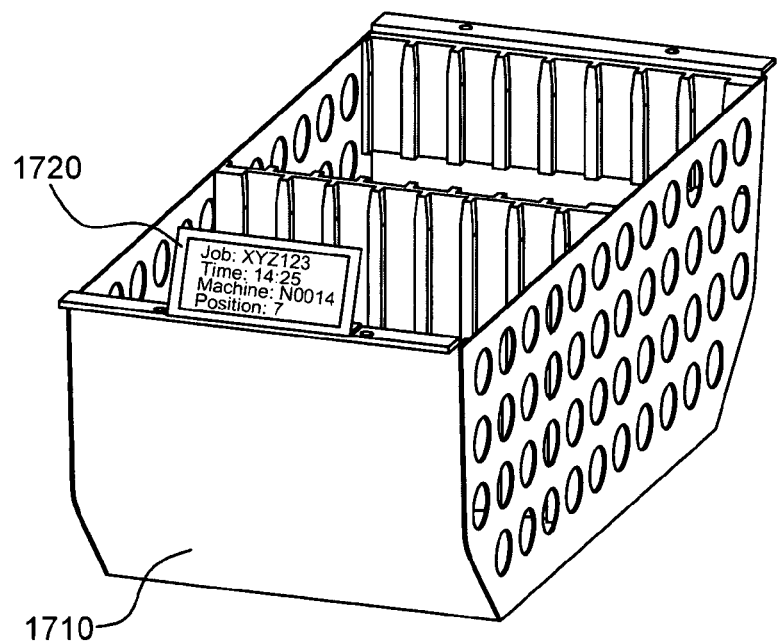
FIG. 17b shows yet an embodiment of the invention, wherein a bin 1710. is configured with an alphanumerical display 120 with an integrated alphanumerical display controller, wherein display data comprises a bin ID.

FIG. 17b shows yet an embodiment of the invention, wherein a bin 1710. is configured with an alphanumerical display 120 with an integrated alphanumerical display controller, wherein display data comprises a bin ID, wherein said bin ID is presented as a bar code, QR code or the like. Thus, the alphanumerical display 120 will function as well as an identity tag of the bin. In one or more embodiment the communications network ID of the alphanumerical display 120, used to send data to and receive data from the alphanumerical display controller, is identical to the bin ID.

Figure 18:
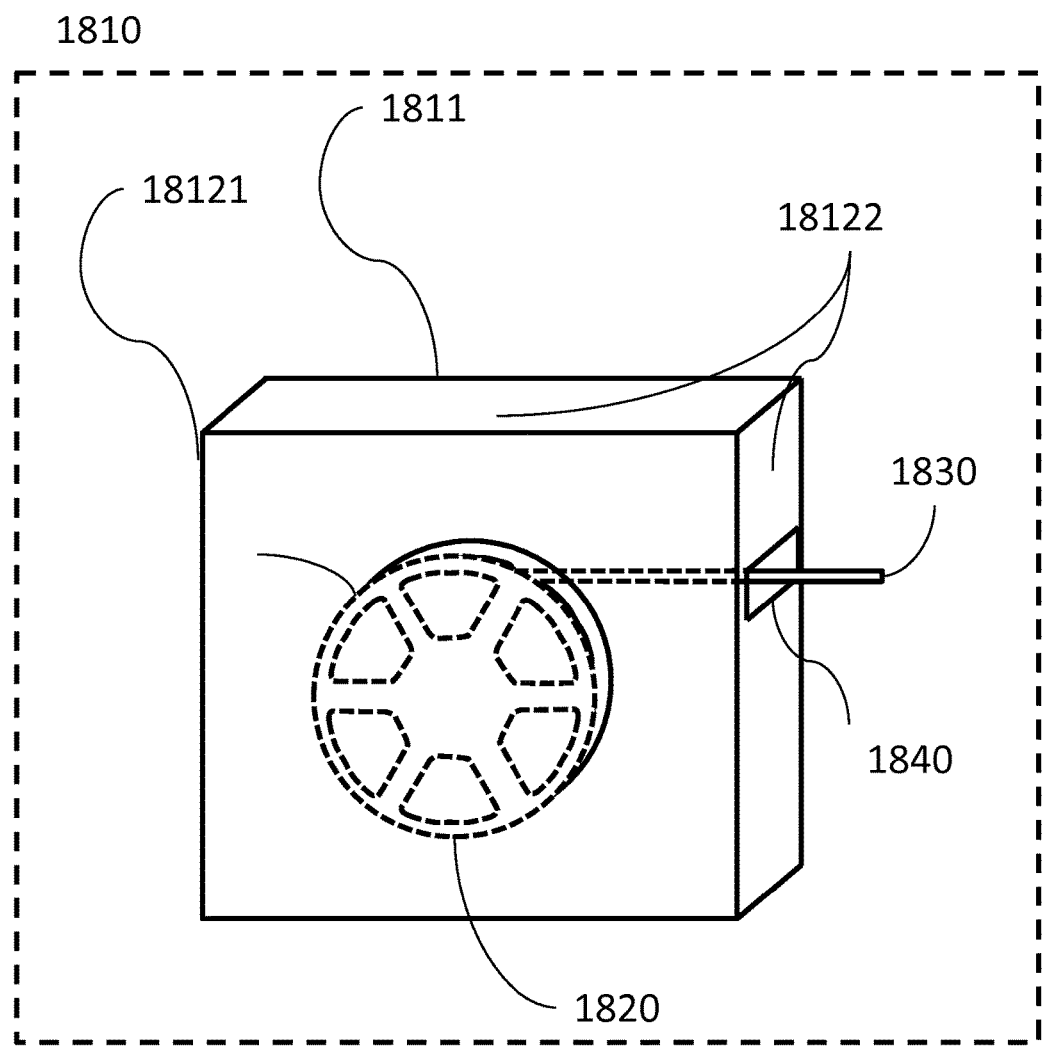
FIG. 18 shows an embodiment of a pallet, wherein the pallet comprises a backplane and a component tape reel retainer structure in the shape of a box.

FIG. 18 shows an embodiment of a pallet 1810, wherein the pallet 1810 comprises a backplane 1811 and a component tape reel retainer structure in the shape of a box, wherein said box is configured with a bottom 18121, and four side walls 18122 and a slit 1840 configured to allow a component tape on a comprised component tape reel 1820 protrude through the slit. In one or more embodiment, the pallet further comprises a friction break configured to engage upon removal of said pallet from said SMT pick and place machine, hereby preventing unwinding of the tape when the reel is no longer feeding components to a pick-and-place machine.

To pre-load the bins to optimize or prepare for presentation at a port of the automated Surface Mount Device (SMD) warehouse based on upcoming SMT jobs, thereby make sure the components required for production of an SMT production unit is present when the bin is presented, the bin load units are redistributed within the same bin or between two or more different bins. The advantage is that bins can be pre-loaded for upcoming SMT jobs, the retrieval time in the tower can be reduced by placing bins required for the next upcoming SMT job close to the port and certain components can be distributed in different automated Surface Mount Device (SMD) warehouses.

Use Case Embodiments

The inventors have realized that with the rising complexity of SMT production comes a greater need for quality data. High part number count, a wide variety of boards, and an ever-changing productions schedule are constant challenges that require improved system support and control of information handling. Through embodiments presented herein, there is achieved efficiency and service level from a customer or operator point of view, in the performing any or all of the steps of planning, associating, loading, replenishing and/or unloading as part of an SMT production process.

FIGS. 19*a-d* show schematically how planning, associating, loading, replenishment and unloading may be performed in accordance with a use case example of a typical workflow in a SMT system.

A planning user starts the workflow by planning an SMT job to be executed and stores said SMT job in an SMT information database. In a use case example referring to FIG. 19*a*, a planning operator uses an SMT planning tool, e.g. a graphical user interface of a computer program that is adapted to help the user optimize the job sequence and changeover strategy for incoming orders to plan an SMT job. The outcome of the planning is typically a bill of materials 1910, in this disclosure also referred to as SMT job data. The bill of material/SMT job data is sent to the automated SMD warehouse 1912, for example corresponding to any of the SMD warehouse 93, 200 of the attached figures. In response to receiving the bill of materials/SMT job data, the automated SMD warehouse automatically delivers bin load units 1914, e.g. in the form of any of the bin load units 420, 620, 630, 640, 650, 720 of the attached figures. In this use case example, the bin load units 1914 are in the form of component tape reels. Typically, the bin load units delivered from the automated SMD warehouse are already in the correct order for loading into bins. An SMT operator, i.e. a human being or alternatively a robot, then retrieves the bin load units that are delivered from said automated Surface Mount Device (SMD) warehouse, and possibly also substrates from separate storage or from said automated Surface Mount Device (SMD) warehouse. In the use case example, the SMT operator retrieves component tape reels from the automated SMD warehouse 1912 and prepares the component tape reels for loading into the pick and place machine 1924. In order to be able to trace the component tape reels, the preparations include a step of associating the ID of each component tape reel with the ID of a feeder 1919. The SMT operator performs this association by scanning each component tape reel and a corresponding feeder using an identity tag scanner 1918. Through scanning of the unique IDs, the SMT system records the movement of the scanned components. Thereby, components are automatically traced. When the bin load units have been associated with the feeders, the SMT operator places the one or more associated component pairs into a bin 1920. The bin may e.g. correspond to any of the bins 410, 510, 610 or 710 of the attached figures. When a bin is ready, the SMT operator places/loads it in the pick and place machine 1924. The pick and place machine may correspond to any of the pick and place machines 91, 550 of the attached figures.

Figure 19A:
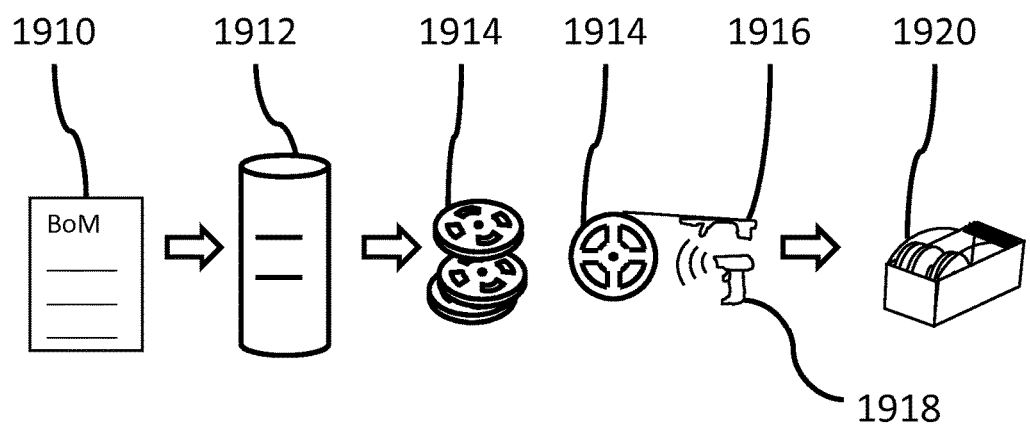
FIGS. 19a-d show schematically how planning, associating, loading, replenishment and unloading may be performed in accordance with a use case example of a typical workflow in a SMT system.
Figure 19B:
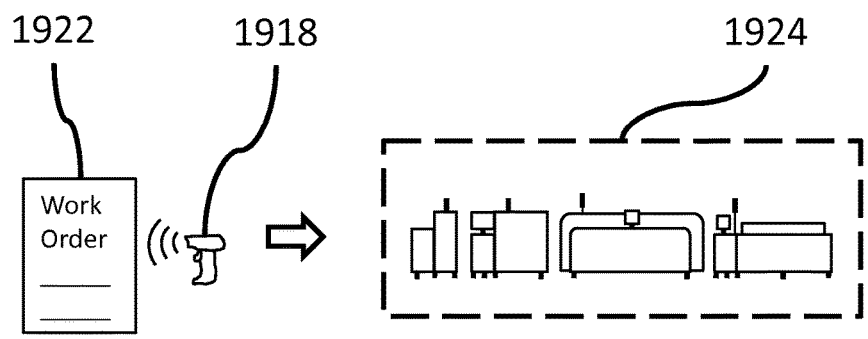

In order for the pick and place machine to know which settings are to be used, SMT job data from the planning step is provided to the pick and place machine, either directly from the planning tool or by the SMT operator scanning the bar code of a work order 1922, using a scanner 1918, comprising the required information/SMT job data. This is illustrated in FIG. 19*b*. Based on the input SMT job data, machine programs are selected automatically, as are conveyor width and loader/unloader settings. In other words, loading into the pick and place machine is fast and easy for the SMT operator as it requires no manual data entry—just one or two scans of bar codes or other identifiers. As soon as the line is up and running, the SMT operator is free to start preparing the next SMT job. Also, as all bins and feeders are given a unique ID, the SMT operator can check quantity, location, MSD data and batch codes, for a single component or a complete component list for an SMT job, at any point during production.

Figure 19C:
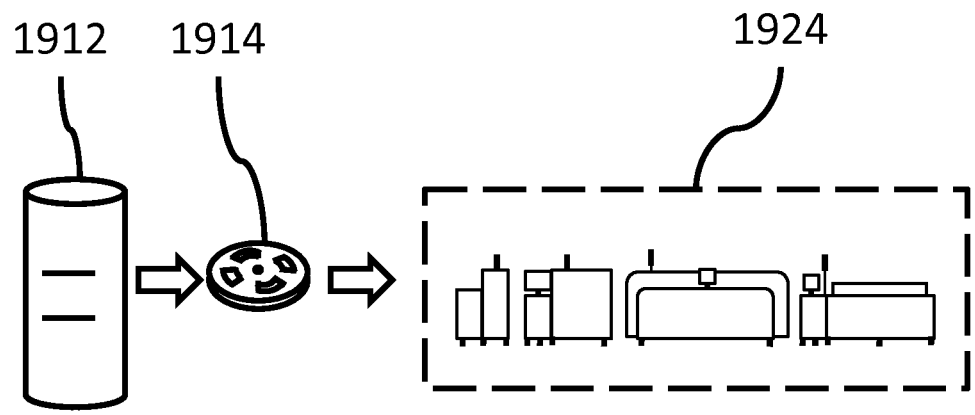

If, at any time, components are about to run out, the machine alerts the operator, re-optimizes and continues mounting other components. The SMT operator that notices such an alert may e.g. press a "provide" button or the like, whereby the SMD warehouse 1912 immediately delivers the requested component/components 1914 for the SMT operator to retrieve, associate and load into the pick and place machine 1924 to replenish the machine. This is illustrated in FIG. 19*c*. Advanced SMT system of today, such as the system embodiments described herein, may also have a plug-and-play simplicity, which means that the SMT operator can load and unload bins in seconds, saving countless hours of operator time. Specially designed software automatically recognizes the presence, absence and location of components, which means that there is no need to program pick positions and production doesn't stop if a bin has runs out of parts.

Figure 19D:
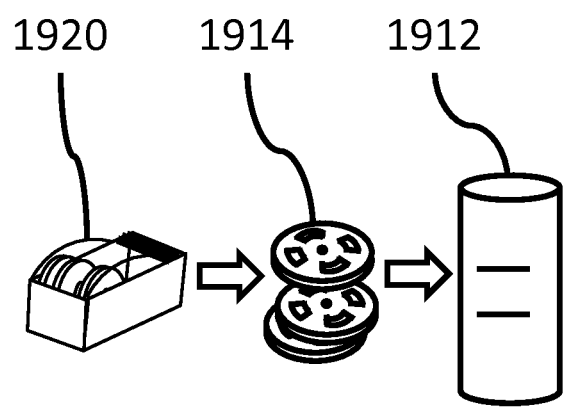

As illustrated in FIG. 19*d*, when an SMT job is done, or when the work day ends, the SMT operator unloads the bins 1920 from the pick and place machine, removes the component tape reels 1914 from the bin and places them back into an SMD warehouse 1912, that can be the same as the one from where the components where retrieved or a different one. As each component has its one identifier, the system keeps track of the components and mix-ups are avoided.

Embodiments of the invention may improve parts or all of the SMT production workflow, as further described herein.

Advantages of the Invention

The present invention relates to handling of components in an SMT system and provides required components of upcoming SMT jobs at an port of an automated Surface Mount Device (SMD) warehouse, thereby reducing retrieval time, configuration time of an SMT pick and place machine and reduced probability of inserting non-required components in an SMT pick and place machine.

Itemized List of Embodiments

An embodiment 1 including a method for retrieving and presenting objects in an automated Surface Mount Device (SMD) warehouse adapted to obtain information related to upcoming SMT jobs, said automated SMD warehouse comprising at least one actuator, such as a robot or robotic arm, configured to automatically handling objects within said automated Surface Mount Device (SMD) warehouse, the method comprising:
- receiving at least one of input data and a parameter representing, or used by said automated Surface Mount Device (SMD) warehouse for determining, a position within said automated Surface Mount Device (SMD) warehouse;
- retrieving, by the use of at least one of said at least one actuator, a bin from said position within said automated SMD warehouse at least partly based on said at least one of input data and/or a parameter representing, or used by said automated Surface Mount Device (SMD) warehouse for determining, said position within said automated Surface Mount Device (SMD) warehouse; and
- presenting, by the use of at least one of said at least one actuator, said retrieved bin at, or close to, an output port, such as an opening, of said automated Surface Mount Device (SMD) warehouse.

An embodiment 2 including a method according to embodiment 1, wherein said automated Surface Mount Device (SMD) warehouse is providing an input/output interface and input data is received from said input/output interface based on an operator indication of an upcoming SMT job.

An embodiment 3 including a method according to embodiment 1, wherein input data is received, or retrieved, from an SMT information database and said input data is associated with, or is indicating, an upcoming SMT job.

An embodiment 4 including a method according to embodiment 1, wherein said parameter representing said position within said automated Surface Mount Device (SMD) warehouse is retrieved from a memory in said automated Surface Mount Device (SMD) warehouse.

An embodiment 5 including a method according to embodiment 1, wherein retrieving a bin is performed based on an upcoming SMT job, wherein the SMT job comprises data indicative of required components in said upcoming SMT job, and wherein said bin has been pre-loaded with bin load units based on said SMT job.

An embodiment 6 including a method according to embodiment 1, wherein said automated Surface Mount Device (SMD) warehouse is a first automated Surface Mount Device (SMD) warehouse part of an integrated automated Surface Mount Device (SMD) warehouse cluster, and wherein retrieving said bin further comprise redistributing said bin from a second automated Surface Mount Device (SMD) warehouse comprised in said integrated automated Surface Mount Device (SMD) warehouse cluster to said first automated Surface Mount Device (SMD) warehouse.

An embodiment 7 including a method in an automated Surface Mount Device (SMD) warehouse adapted to obtain information related to upcoming SMT jobs and to store SMT job related objects at a plurality of positions within said automated Surface Mount Device (SMD) warehouse, said automated SMD warehouse comprising at least one actuator, such as a robot or robotic arm, configured to automatically handling objects within said automated Surface Mount Device (SMD) warehouse, the method is comprising:
- receiving a bin at an input port such as an opening of said automated Surface Mount Device (SMD) warehouse;
- automatically determining, by the use of at least one of said at least one actuator and/or a barcode scanner comprised in said automated SMD warehouse, tape reel identities of component tape reels comprised in said bin;
- automatically storing, by the use of at least one of said at least one actuator and/or a barcode scanner comprised in said automated SMD warehouse, said bin at one of said plurality of positions within said automated Surface Mount Device (SMD) warehouse, wherein said bin is comprising a plurality of bin load units, and wherein each of said plurality of bin load units is comprising or constituting a component tape reel.

An embodiment 8 including a method according to embodiment 7, wherein said determining of tape reel identities of component tape reels comprised in said bin comprises:
- automatically scanning, by the use of said actuator and/or a barcode scanner comprised in said automated SMD warehouse, individual identity tags attached to component tape reels; and
- automatically storing, by the use of said actuator, the identity (ID) of each component tape reel scanned and the position of the stored bin to at least one of a memory in said automated Surface Mount Device (SMD) warehouse and/or in an SMT information database, wherein said information about the identity of each component tape reel is stored in said automated Surface Mount Device (SMD) warehouse and/or in an SMT information database so that the information may further be used for automatically preparing an SMT job and/or when retrieving a bin from said position within said automated SMD warehouse.

An embodiment 9 including any of the methods of embodiments 1 to 8, wherein said individual identity tags are barcodes adapted to be scanned by a barcode scanner unit comprised or connected to said automated Surface Mount Device (SMD) warehouse and through said scanning, provide information to the barcode scanner unit and said automated Surface Mount Device (SMD) warehouse.

An embodiment 10 including any of the methods of embodiments 1 to 9, wherein said determining tape reel identities of component tape reels comprised in said bin is comprising:
- scanning, or reading, individual identity tags attached to pallets comprising component tape reels, whereby individual pallet IDs are obtained from said scanning or reading of individual identity tags attached to pallets; and
- retrieving the ID of component tape reels associated with said obtained pallet ID's from said SMT information database.

An embodiment 11 including any of the methods of embodiments 1 to 10, wherein said determining of tape reel identities of component tape reels comprised in said bin is comprising:
- scanning or reading an identity tag attached to said bin to obtain bin IDs;
- retrieving the IDs of component tape reel IDs associated to said bin IDs from said SMT information database.

An embodiment 12 including an integrated automated Surface Mount Device (SMD) warehouse cluster, wherein said plurality of Surface Mount Device (SMD) warehouses are configured to automatically redistribute bins or bin load units between a first and a second automated Surface Mount Device (SMD) warehouse of said cluster of plurality of automated Surface Mount Device (SMD) warehouses via a first opening in the first automated Surface Mount Device (SMD) warehouse and a second opening in the second automated Surface Mount Device (SMD) warehouse, and wherein a first actuator in the first automated Surface Mount Device (SMD) warehouse is configured to handle or grip a bin or bin load unit in the second opening and a second actuator in the second automated Surface Mount Device (SMD) warehouse is configured to handle or grip a bin or bin load unit in the first opening such that the bin or bin load units can be redistributed between said first Surface Mount Device (SMD) warehouse and said second Surface Mount Device (SMD) warehouse, wherein each of said bins is comprising a plurality of slots or compartments each configured for carrying/holding a bin load unit and wherein each bin load unit comprises or constitutes a component tape reel.

An embodiment 13 including an automated Surface Mount Device (SMD) warehouse, or cluster of automated SMD warehouses, comprising:
a processor, and
an actuator, such as a robot or robotic arm, communicatively coupled to said processor;
wherein said processor is configured to receiving at least one of input data and a parameter representing, or used by said processor for determining, a position within said automated Surface Mount Device (SMD) warehouse, or representing a position within a cluster of automated Surface Mount Device (SMD) warehouses each comprising at least one actuator, and to send control data to the actuator at least partly based on the obtained information and/or instructions;
wherein the actuator is configured to retrieve a bin, carrying/holding a plurality of bin load units, from said position within the automated Surface Mount Device (SMD) warehouse, or from a position within a cluster of automated Surface Mount Device (SMD) warehouses, each comprising at least one actuator, and presenting said retrieved bin at, or close to, an output port, such as an opening, of said automated Surface Mount Device (SMD) warehouse based on control data received from said processor.

An embodiment 14 including the automated Surface Mount Device (SMD) warehouse of any of the embodiments 12 and 13, wherein said automated SMD warehouse is an integrated cluster of automated SMD warehouses including a first automated SMD warehouse comprising said processor and actuator, each of said plurality of automated SMD warehouses comprising at least one actuator, such as a robot, wherein said plurality of automated SMD warehouses are configured to storing and retrieving bins, and wherein said plurality of automated SMD warehouses are further configured to retrieving and redistributing a bin, such as a trolley, from a storage position in a second automated Surface Mount Device (SMD) warehouse of said integrated automated Surface Mount Device (SMD) warehouse cluster to said first automated Surface Mount Device (SMD) warehouse, and wherein said plurality of automated SMD warehouses are further configured to presenting said retrieved bin at, or close to, an output port, such as an opening, of said first automated Surface Mount Device (SMD) warehouse.

An embodiment 15 including the automated SMD warehouse in any of the embodiments 12 to 14, further comprising an input/output interface, and wherein said processor is configured to receive input data from said input/output interface based on an operator indication of an upcoming SMT job.

The invention claimed is:

1. A method for retrieving and presenting objects in a first automated Surface Mount Device (SMD) warehouse, the first automated SMD warehouse adapted to obtain information related to upcoming Surface Mount Technology (SMT) jobs, said first automated SMD warehouse including at least one actuator configured to automatically handle objects within said first automated SMD warehouse, the method comprising:
receiving at least one of input data or a parameter, the at least one of input data or parameter indicative of a position within said first automated SMD warehouse;
retrieving, by said at least one actuator, a bin from said position within said first automated SMD warehouse according to an upcoming SMT job and at least partly based on said at least one of input data or parameter, wherein
the bin includes a plurality of slots or compartments,
each of the plurality of slots or compartments is configured to hold a bin load unit,
each bin load unit includes a pallet including a component tape reel, the pallet including a particular gripping area configured to enable gripping of the pallet by the at least one actuator, and
said bin has been loaded with bin load units based on said upcoming SMT job; and
presenting, by at least one of said at least one actuator, said bin at an output port of said first automated SMD warehouse.

2. The method of claim 1, further comprising:
receiving the input data via an interface based on an operator indication of the upcoming SMT job.

3. The method of claim 1, wherein the receiving comprises:
one of receiving and retrieving the input data from an SMT information database, said input data associated with, or indicative of, the upcoming SMT job.

4. The method of claim 1, further comprising:
retrieving said parameter from a memory in said first automated SMD warehouse.

5. The method of claim 1, wherein
said first automated SMD warehouse is part of an integrated automated SMD warehouse cluster including the first automated SMD warehouse and a second automated SMD warehouse; and
the retrieving said bin further includes
redistributing said bin from the second automated SMD warehouse to said first automated SMD warehouse.

6. The method of claim 1, wherein the at least one actuator is a robot or robotic arm.

7. The method of claim 1, wherein the output port is an opening of said automated SMD warehouse.

8. The method of claim 1, wherein the at least one of input data or parameter, one of
represents the position within said automated SMD warehouse; or is used by said automated SMD warehouse for determining the position within said automated SMD warehouse.

9. The method of claim 1, wherein the output port is an opening of said automated SMD warehouse.

10. A method in an automated Surface Mount Device (SMD) warehouse adapted to obtain information related to upcoming Surface Mount Technology (SMT) jobs, and to store SMT job related objects at a plurality of positions within said automated SMD warehouse, said automated SMD warehouse including at least one actuator configured to automatically handle the SMT job related objects within said automated SMD warehouse, the method comprising:
receiving a bin at an input port of said automated SMD warehouse, said bin including a plurality of bin load units, each of said plurality of bin load units including a pallet including a component tape reel, the pallet including a particular gripping area configured to enable gripping of the pallet by the at least one actuator;
automatically determining tape reel identifiers of the component tape reels in said bin, said automatically determining including at least one of
scanning, using a barcode scanner in said automated SMD warehouse, identity tags of the plurality of bin load units in said bin at the input port with the plurality of bin load units positioned in respective slots or compartments of said bin,
moving, using said at least one actuator, the plurality of bin load units in said bin into positions in which the identity tags of the plurality of bin load units are scannable by a fixed bar code scanner in the automated SMD warehouse, or
obtaining a bin identifier for the bin by scanning or reading an identity tag attached to said bin, and retrieving, from an SMT information database, the tape reel identifiers of the component tape reels associated with said bin identifier; and
automatically storing, using said at least one actuator, said bin at one of said plurality of positions within said automated SMD warehouse.

11. The method of claim 10, wherein said automatically determining tape reel identifiers of the component tape reels in said bin comprises:
automatically scanning, using the barcode scanner in said automated SMD warehouse, individual identity tags attached to the component tape reels; and
automatically storing the identifier of each scanned identity tag and the position of the stored bin to a memory in said automated SMD warehouse or in the SMT information database, wherein
said identifier of each identity tag is stored such that the identifier is usable for at least one of automatically preparing an SMT job or when retrieving said bin from said position within said automated SMD warehouse.

12. The method of claim 10, wherein
said identity tags are barcodes; and
the method further includes
scanning the barcodes to provide information to said automated SMD warehouse.

13. The method of claim 10, wherein said automatically determining tape reel identifiers of the component tape reels in said bin comprises:
scanning, or reading, identity tags attached to pallets including the component tape reels, to obtain pallet identifiers for the pallets; and
retrieving tape reel identifiers of the component tape reels associated with said obtained pallet identifiers from said SMT information database.

14. The method of claim 10, wherein the at least one actuator is a robot or robotic arm.

15. An integrated automated Surface Mount Device (SMD) warehouse cluster comprising:
a first automated SMD warehouse having a first opening and a first actuator; and
a second automated SMD warehouse having a second opening and a second actuator; wherein
the first actuator is configured to handle or grip a bin in the second opening, and the second actuator is configured to handle or grip a bin in the first opening,
the integrated automated SMD warehouse cluster is configured to automatically redistribute bins between the first and second automated SMD warehouses using the first actuator and the second actuator via the first opening and the second opening; wherein
each bin includes a plurality of slots or compartments,
each of the plurality of slots or compartments is configured to hold a bin load unit, and
each bin load unit includes a pallet including component tape reel, the pallet including a particular gripping area configured to enable gripping of the pallet by at least one actuator of the first actuator and the second actuator.

16. The cluster of claim 15, wherein said cluster is further configured to redistribute bin load units among the first and second automated SMD warehouses.

17. The cluster of claim 15, wherein said cluster is configured to redistribute bins among the first and second automated SMD warehouses.

18. A cluster of automated Surface Mount Device (SMD) warehouses, each automated SMD warehouse comprising:
a processor, and
an actuator communicatively coupled to said processor;
wherein said processor is configured to
receive at least one of input data or a parameter, the at least one of input data or parameter indicative of a position within said automated SMD warehouse, or a position within the cluster of automated SMD warehouses, and
send control data to the actuator based on the at least one of input data or parameter;
wherein the actuator is configured to, based on the control data,
retrieve a bin from (i) said position within the automated SMD warehouse or (ii) the position within the cluster of automated SMD warehouses,
present said retrieved bin at an output port of said automated SMD warehouse; and
wherein each automated SMD warehouse is configured to store and retrieve bins;
wherein said cluster of automated SMD warehouses is further configured to retrieve and redistribute bins between storage positions in different ones of the automated SMD warehouses;
wherein each automated SMD warehouse is further configured to present said retrieved bin at an output port of said automated SMD warehouse;
wherein each bin includes a plurality of slots or compartments;
wherein each of the plurality of slots or compartments is configured to hold a bin load unit; and wherein each bin load unit includes a pallet including a component tape reel, the pallet including a particular gripping area configured to enable gripping of the pallet by at least one actuator of the first actuator and the second actuator.

19. The cluster of automated SMD warehouses of claim 18, further comprising:
an interface; wherein
said processor is configured to receive the input data from said interface based on an operator indication of an upcoming SMT job.

20. The cluster of automated SMD warehouses of claim 18, further comprising:
a communications interface configured to at least one of receive or retrieve the input data from a SMT information database via a communications network, wherein
said processor is further configured to receive the input data from said communications network, said input data associated with, or indicative of, an upcoming SMT job.

21. The cluster of automated SMD warehouses of claim 18, wherein the actuator is a robot or robotic arm.

22. The cluster of automated SMD warehouses of claim 18, wherein the bin is a trolley.

23. The cluster of automated SMD warehouses of claim 18, wherein the output port is an opening of said automated SMD warehouse.

* * * * *